US012652049B2

(12) United States Patent
Inoue et al.

(10) Patent No.: US 12,652,049 B2
(45) Date of Patent: Jun. 9, 2026

(54) LOGIC CIRCUIT FORMED USING UNIPOLAR TRANSISTOR, AND SEMICONDUCTOR DEVICE

(71) Applicant: Semiconductor Energy Laboratory Co., Ltd., Atsugi (JP)

(72) Inventors: Hiroki Inoue, Atsugi (JP); Munehiro Kozuma, Atsugi (JP); Takeshi Aoki, Ebina (JP); Shuji Fukai, Atsugi (JP); Fumika Akasawa, Sagamihara (JP); Shintaro Harada, Kawasaki (JP); Sho Nagao, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 149 days.

(21) Appl. No.: 18/766,726

(22) Filed: Jul. 9, 2024

(65) Prior Publication Data

US 2024/0364343 A1      Oct. 31, 2024

Related U.S. Application Data

(62) Division of application No. 17/413,791, filed as application No. PCT/IB2019/060590 on Dec. 10, 2019, now Pat. No. 12,040,795.

(30) Foreign Application Priority Data

Dec. 20, 2018      (JP) ................................. 2018-238735

(51) Int. Cl.
*H03K 19/094*      (2006.01)
*H10D 84/80*      (2025.01)

(52) U.S. Cl.
CPC ......... *H03K 19/094* (2013.01); *H10D 84/811* (2025.01)

(58) Field of Classification Search
CPC ...... H03K 19/02; H03K 19/08; H03K 19/094; H03K 19/0944; H03K 19/0948
See application file for complete search history.

(56) References Cited

U.S. PATENT DOCUMENTS

| | | | |
|---|---|---|---|
| 3,506,851 A | | 4/1970 | Polkinghorn et al. |
| 3,774,055 A | | 11/1973 | Bapat |
| | | (Continued) | |

FOREIGN PATENT DOCUMENTS

| | | | |
|---|---|---|---|
| CN | 102208167 A | 10/2011 | |
| CN | 104867464 A | 8/2015 | |
| | (Continued) | | |

OTHER PUBLICATIONS

US 6,646,476 B2, 11/2003, Nagao et al. (withdrawn)
(Continued)

*Primary Examiner* — Jason M Crawford
(74) *Attorney, Agent, or Firm* — Eric J. Robinson; Robinson Intellectual Property Law Office, P.C.

(57) ABSTRACT

A semiconductor device using unipolar transistors, in which high and low levels are expressed using high and low power supply potentials, is provided. The semiconductor device includes four transistors, two capacitors, two wirings, two input terminals, and an output terminal. A source or a drain of the first transistor and a source or a drain of the fourth transistor are electrically connected to the first wiring. A gate of the fourth transistor is electrically connected to the first input terminal, and a gate of the second transistor is electrically connected to the second input terminal. A source or a drain of the second transistor and a source or a drain of the third transistor are electrically connected to the second wiring. The first transistor, the second transistor, and the two capacitors are electrically connected to the output terminal.

4 Claims, 23 Drawing Sheets

50

(56) References Cited

U.S. PATENT DOCUMENTS

| | | | |
|---|---|---|---|
| 3,898,479 A | 8/1975 | Proebsting | |
| 4,090,096 A | 5/1978 | Nagami | |
| 4,390,803 A | 6/1983 | Koike | |
| 4,412,139 A | 10/1983 | Horninger | |
| 4,443,714 A | 4/1984 | Nakano et al. | |
| 4,489,246 A | 12/1984 | Nishiuchi | |
| 4,558,234 A | 12/1985 | Suzuki et al. | |
| 4,582,395 A | 4/1986 | Morozumi | |
| 4,633,105 A | 12/1986 | Tsujimoto | |
| 4,763,136 A | 8/1988 | Isobe | |
| 4,804,870 A | 2/1989 | Mahmud | |
| 4,959,697 A | 9/1990 | Shier et al. | |
| 5,467,038 A | 11/1995 | Motley et al. | |
| 5,548,143 A | 8/1996 | Lee | |
| 5,643,826 A | 7/1997 | Ohtani et al. | |
| 5,694,061 A * | 12/1997 | Morosawa | G09G 3/3677 |
| | | | 326/88 |
| 5,870,071 A | 2/1999 | Kawahata | |
| 5,889,291 A | 3/1999 | Koyama et al. | |
| 5,949,271 A | 9/1999 | Fujikura | |
| 5,949,398 A | 9/1999 | Kim | |
| 5,952,991 A | 9/1999 | Akiyama | |
| 6,040,810 A | 3/2000 | Nishimura | |
| 6,049,228 A | 4/2000 | Moon | |
| 6,091,393 A | 7/2000 | Park | |
| 6,333,658 B1 | 12/2001 | Akita et al. | |
| 6,384,804 B1 | 5/2002 | Dodabalapur et al. | |
| 6,501,098 B2 | 12/2002 | Yamazaki | |
| 6,522,323 B1 | 2/2003 | Sasaki et al. | |
| 6,542,138 B1 | 4/2003 | Shannon et al. | |
| 6,686,899 B2 | 2/2004 | Miyazawa. et al. | |
| 6,788,108 B2 | 9/2004 | Miyake et al. | |
| 6,813,332 B2 | 11/2004 | Nagao et al. | |
| 6,928,136 B2 | 8/2005 | Nagao et al. | |
| 6,975,142 B2 | 12/2005 | Azami et al. | |
| 7,091,749 B2 | 8/2006 | Miyake et al. | |
| 7,202,863 B2 | 4/2007 | Kimura et al. | |
| 7,307,463 B2 | 12/2007 | Miyake et al. | |
| 7,362,139 B2 | 4/2008 | Miyake et al. | |
| RE41,215 E | 4/2010 | Miyake et al. | |
| 7,786,985 B2 | 8/2010 | Kimura et al. | |
| 7,847,593 B2 | 12/2010 | Yoshida | |
| 7,864,151 B1 | 1/2011 | Yamazaki et al. | |
| 8,044,906 B2 | 10/2011 | Kimura et al. | |
| 8,059,078 B2 | 11/2011 | Kimura et al. | |
| RE43,401 E | 5/2012 | Miyake et al. | |
| 8,284,182 B2 * | 10/2012 | Yamamoto | G11C 19/28 |
| | | | 326/112 |
| 8,300,039 B2 | 10/2012 | Yamamoto. et al. | |
| 8,310,474 B2 | 11/2012 | Koyama et al. | |
| 8,427,206 B2 | 4/2013 | Yamamoto et al. | |
| 8,446,177 B2 | 5/2013 | Yamamoto. et al. | |
| 8,456,402 B2 | 6/2013 | Kimura et al. | |
| 8,508,967 B2 | 8/2013 | Yamazaki et al. | |
| RE44,657 E | 12/2013 | Miyake et al. | |
| 8,823,620 B2 | 9/2014 | Kimura et al. | |
| 8,848,449 B2 | 9/2014 | Endo | |
| 8,994,439 B2 | 3/2015 | Kaneyasu et al. | |
| 9,190,425 B2 | 11/2015 | Kimura et al. | |
| 9,450,581 B2 | 9/2016 | Tamura | |
| 9,590,594 B2 | 3/2017 | Kozuma | |
| 9,640,135 B2 | 5/2017 | Kimura et al. | |
| 9,647,665 B2 | 5/2017 | Inoue et al. | |
| 9,653,490 B2 | 5/2017 | Umezaki | |
| 9,715,906 B2 | 7/2017 | Ishizu et al. | |
| 9,755,643 B2 | 9/2017 | Inoue et al. | |
| 9,881,582 B2 | 1/2018 | Kimura et al. | |
| 9,935,633 B2 | 4/2018 | Tamura | |
| 10,121,448 B2 | 11/2018 | Kimura et al. | |
| 10,373,581 B2 | 8/2019 | Kimura et al. | |
| 10,453,866 B2 | 10/2019 | Umezaki | |
| 10,497,335 B2 | 12/2019 | Noh et al. | |
| 10,867,576 B2 | 12/2020 | Kimura et al. | |
| 11,005,475 B1 | 5/2021 | Hashimoto et al. | |
| 11,217,200 B2 | 1/2022 | Kimura et al. | |
| 11,776,969 B2 | 10/2023 | Umezaki | |
| 12,040,795 B2 * | 7/2024 | Inoue | H10D 84/811 |
| 2001/0002703 A1 | 6/2001 | Koyama | |
| 2001/0045565 A1 | 11/2001 | Yamazaki | |
| 2002/0011973 A1 | 1/2002 | Komiya | |
| 2002/0044208 A1 | 4/2002 | Yamazaki et al. | |
| 2002/0089496 A1 | 7/2002 | Numao | |
| 2002/0097212 A1 | 7/2002 | Miyazawa. et al. | |
| 2002/0158666 A1 | 10/2002 | Azami et al. | |
| 2002/0167026 A1 | 11/2002 | Azami et al. | |
| 2002/0190326 A1 | 12/2002 | Nagao et al. | |
| 2003/0011584 A1 | 1/2003 | Azami et al. | |
| 2003/0020520 A1 | 1/2003 | Miyake et al. | |
| 2003/0034806 A1 | 2/2003 | Azami | |
| 2003/0052324 A1 | 3/2003 | Kimura | |
| 2003/0076149 A1 | 4/2003 | Haga | |
| 2003/0107688 A1 | 6/2003 | Yamagishi | |
| 2003/0111677 A1 | 6/2003 | Miyake | |
| 2004/0174189 A1 | 9/2004 | Nagao et al. | |
| 2004/0252111 A1 | 12/2004 | Cheon et al. | |
| 2004/0253781 A1 | 12/2004 | Kimura et al. | |
| 2004/0257353 A1 | 12/2004 | Imamura. et al. | |
| 2006/0290380 A1 | 12/2006 | Miyake et al. | |
| 2008/0101529 A1 | 5/2008 | Tobita | |
| 2008/0187089 A1 | 8/2008 | Miyayama. et al. | |
| 2008/0315918 A1 | 12/2008 | Luo et al. | |
| 2010/0244946 A1 | 9/2010 | Murakami et al. | |
| 2010/0245335 A1 | 9/2010 | Kimura et al. | |
| 2011/0115545 A1 | 5/2011 | Koyama et al. | |
| 2011/0241729 A1 | 10/2011 | Yamamoto. et al. | |
| 2012/0242370 A1 | 9/2012 | Park et al. | |
| 2012/0293397 A1 | 11/2012 | Tatara et al. | |
| 2014/0225641 A1 | 8/2014 | Kozuma et al. | |
| 2014/0225644 A1 | 8/2014 | Aoki et al. | |
| 2014/0266326 A1 | 9/2014 | Ancis et al. | |
| 2014/0266379 A1 | 9/2014 | Inoue et al. | |
| 2015/0061742 A1 | 3/2015 | Maehashi. et al. | |
| 2015/0077162 A1 | 3/2015 | Yamazaki et al. | |
| 2015/0263725 A1 | 9/2015 | Onuki | |
| 2015/0380451 A1 | 12/2015 | Kurokawa | |
| 2016/0064444 A1 * | 3/2016 | Inoue | H04N 25/771 |
| | | | 257/43 |
| 2016/0182038 A1 | 6/2016 | Pandita | |
| 2016/0343337 A1 | 11/2016 | Dai | |
| 2016/0352312 A1 | 12/2016 | Yang et al. | |
| 2017/0125440 A1 * | 5/2017 | Kozuma | H10D 30/6755 |
| 2017/0141776 A1 | 5/2017 | Kozuma | |
| 2017/0186373 A1 | 6/2017 | Nishikawa et al. | |
| 2018/0040274 A1 | 2/2018 | Kurokawa | |
| 2018/0144711 A1 | 5/2018 | Noh et al. | |
| 2018/0151593 A1 | 5/2018 | Inoue et al. | |
| 2018/0152189 A1 | 5/2018 | Papadopoulos et al. | |
| 2018/0302091 A1 * | 10/2018 | Agan | H03K 5/1506 |
| 2019/0033675 A1 | 1/2019 | Umezaki | |
| 2020/0007114 A1 * | 1/2020 | Kimura | G11C 11/54 |
| 2021/0167095 A1 | 6/2021 | Ishizu et al. | |
| 2022/0045683 A1 * | 2/2022 | Inoue | H10D 30/6755 |
| 2022/0102340 A1 * | 3/2022 | Takahashi | H10D 87/00 |
| 2022/0122562 A1 | 4/2022 | Kimura et al. | |
| 2022/0173737 A1 * | 6/2022 | Inoue | H03K 19/0185 |
| 2022/0294402 A1 * | 9/2022 | Takahashi | H03K 5/08 |
| 2024/0364343 A1 * | 10/2024 | Inoue | H10D 84/811 |
| 2025/0031449 A1 | 1/2025 | Umezaki | |

FOREIGN PATENT DOCUMENTS

| | | | |
|---|---|---|---|
| CN | 108091305 A | 5/2018 | |
| EP | 0055570 A | 7/1982 | |
| EP | 0058958 A | 9/1982 | |
| EP | 2221973 A | 8/2010 | |
| EP | 3324397 A | 5/2018 | |
| JP | 57-106235 A | 7/1982 | |
| JP | 57-141128 A | 9/1982 | |
| JP | 09-246936 A | 9/1997 | |
| JP | 2002-328643 A | 11/2002 | |
| JP | 2003-179479 A | 6/2003 | |
| JP | 2004-222256 A | 8/2004 | |
| JP | 2009-188749 A | 8/2009 | |
| JP | 2009/081619 | 5/2011 | |

(56)                    References Cited

FOREIGN PATENT DOCUMENTS

| | | |
|---|---|---|
| JP | 2011-217287 A | 10/2011 |
| JP | 2011-229129 A | 11/2011 |
| JP | 2012-243971 A | 12/2012 |
| JP | 2012-256820 A | 12/2012 |
| JP | 2017-017693 A | 1/2017 |
| JP | 2018-093483 A | 6/2018 |
| KR | 2011-0109896 A | 10/2011 |
| KR | 2018-0057776 A | 5/2018 |
| KR | 2018-0061057 A | 6/2018 |

OTHER PUBLICATIONS

Chinese Office Action (Application No. 201980082466.1) Dated May 16, 2025.
International Search Report (Application No. PCT/IB2019/060590) Dated Mar. 31, 2020.
Written Opinion (Application No. PCT/IB2019/060590) Dated Mar. 31, 2020.

Lym.H et al., "5V input level shifter circuit for IGZO thin-film transistors", IEICE Electronics Express, 2014, vol. 11, No. 13, pp. 1-6.
De roose.F et al., "A Flexible Thin-Film Pixel Array with a Charge-to-Current Gain of 59μA/pC and 0.33% Nonlinearity and a Cost Effective Readout Circuit for Large-Area X-ray Imaging", ISSCC 2016 (Digest of Technical Papers. IEEE International Solid-State Circuits Conference), Jan. 31, 2016, pp. 296-297.
Myny.K et al., "A Flexible ISO14443-A Compliant 7.5mW 128b Metal-Oxide NFC Barcode Tag with Direct Clock Division Circuit from 13.56MHz Carrier", ISSCC 2017 (Digest of Technical Papers. IEEE International Solid-State Circuits Conference), Feb. 5, 2017, pp. 258-259.
Garripoli.C et al., "An a-IGZO Asynchronous Delta-Sigma Modulator on Foil Achieving up to 43dB SNR and 40dB SNDR in 300Hz Bandwidth", ISSCC 2017 (Digest of Technical Papers. IEEE International Solid-State Circuits Conference), Feb. 5, 2017, pp. 260-261.

* cited by examiner

10

20

<u>31</u>

<u>32</u>

<u>10</u>

<u>10</u>

40

50

40

50

<u>60</u>

<u>70</u>

FIG. 14A
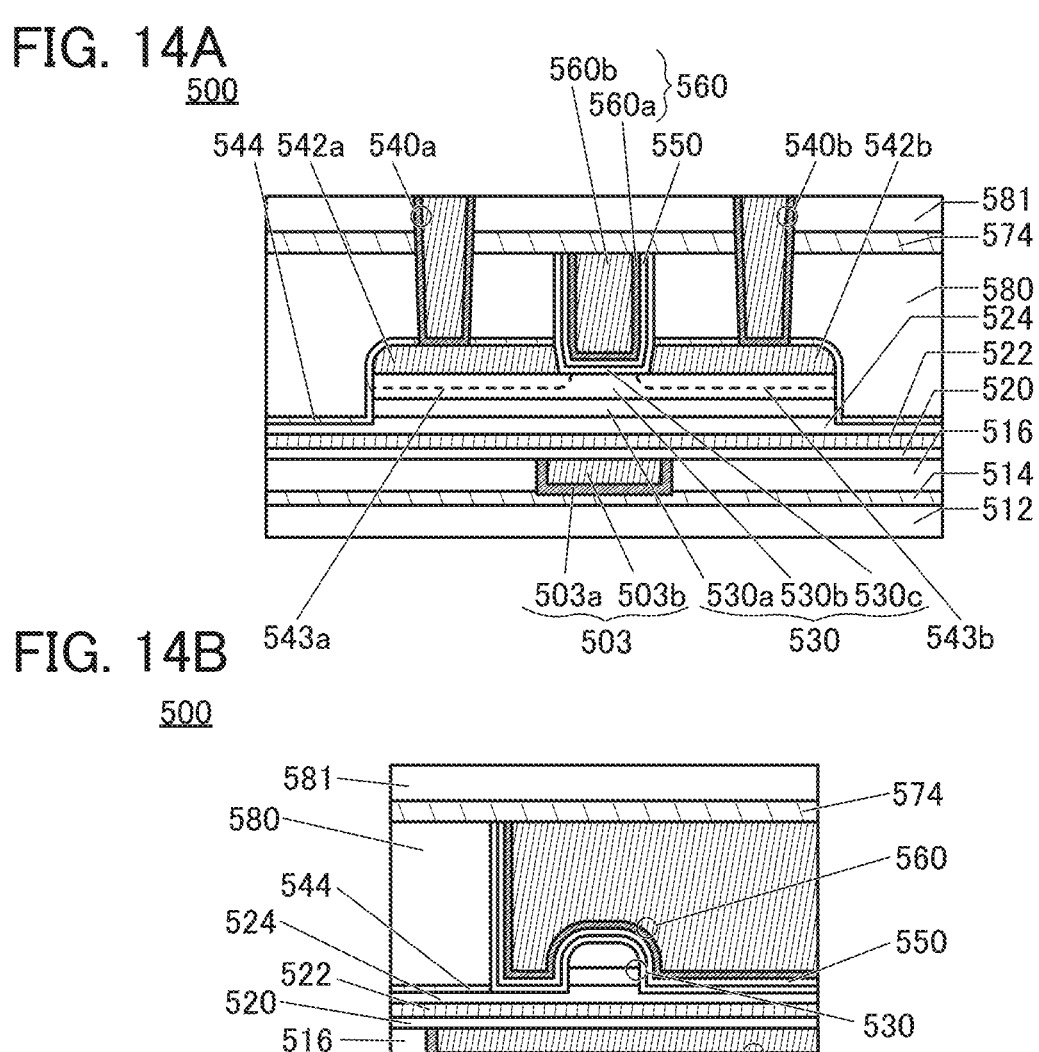
FIG. 14B
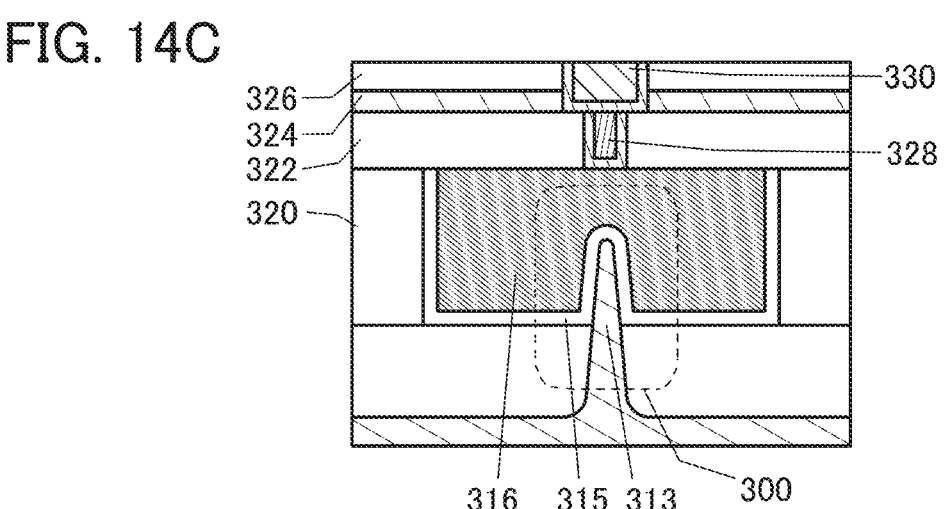
FIG. 14C

510A 542a  546a  505  W2  546b  542b

L1 —————————————————————— L2

530a,530b  503  W1  560  530c,550

582  524  521  514
584  530  522  516  W2

560  503  W1
505  511

560
546a  560b  546b
542a  560a  550  542b 584
582
580
574
524
522
521
516
514
512
511

L1  503  505a  530c  L2
505b  530a  530b
505  530

FIG. 17A
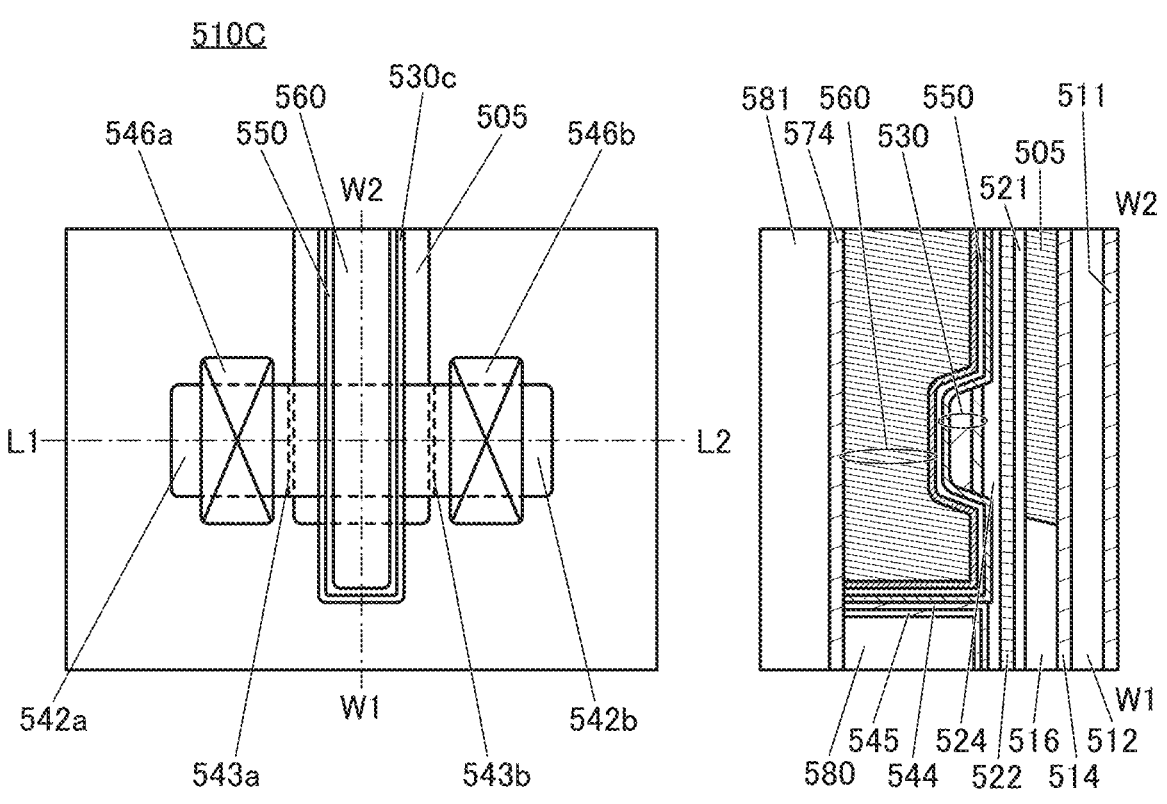
FIG. 17C
FIG. 17B
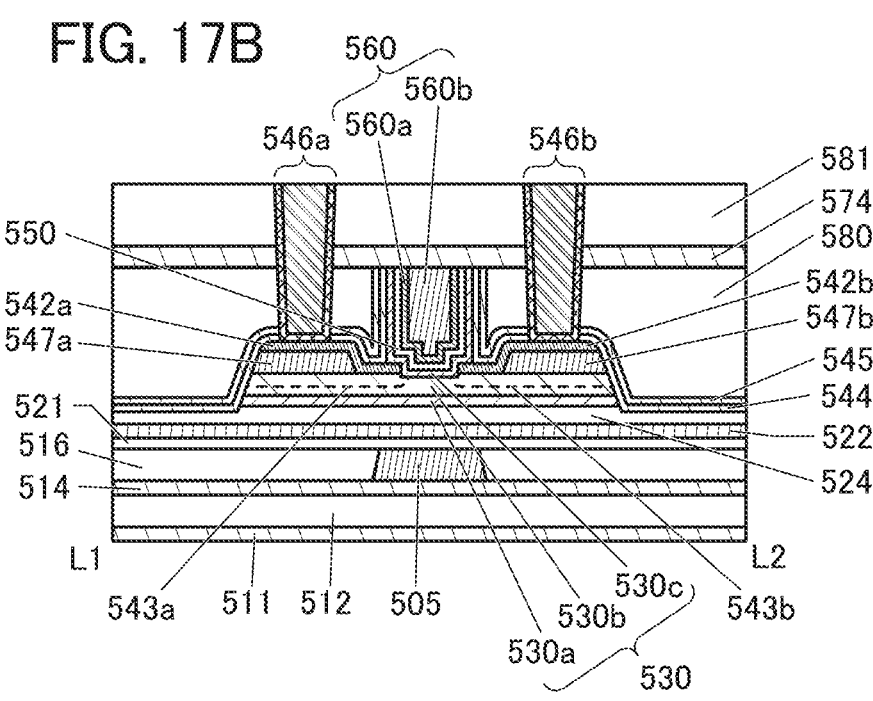

FIG. 18A
510D
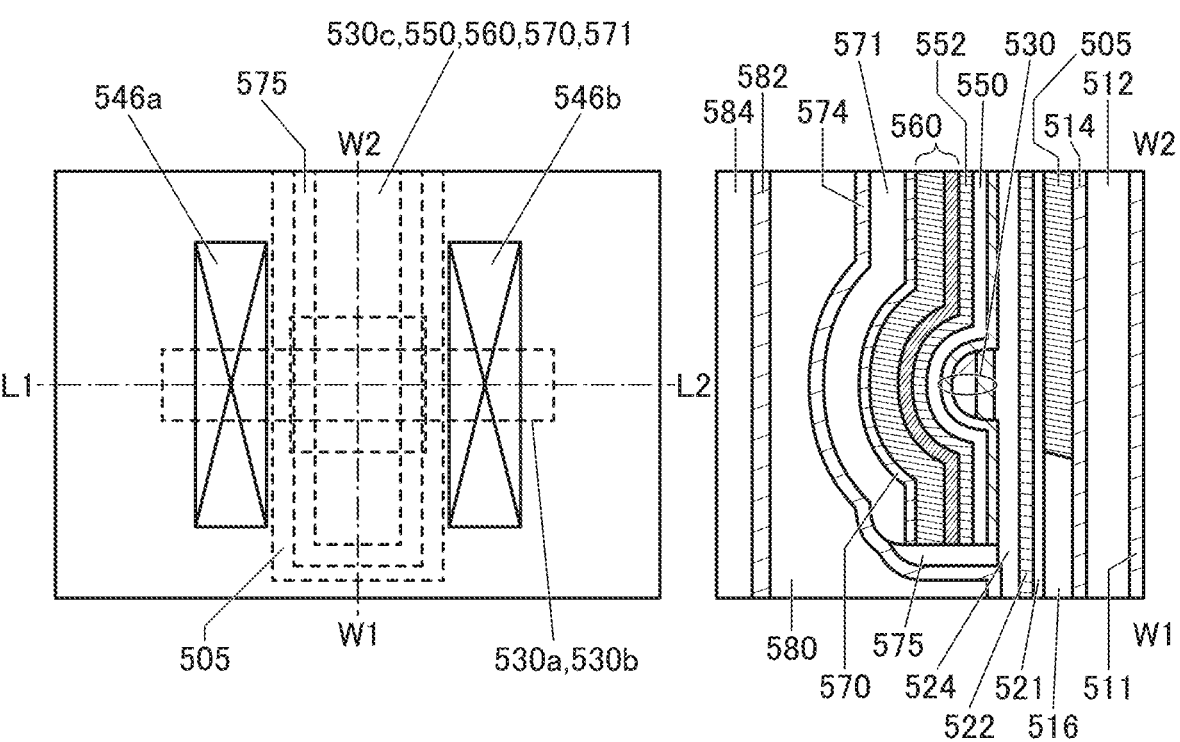
FIG. 18C
FIG. 18B
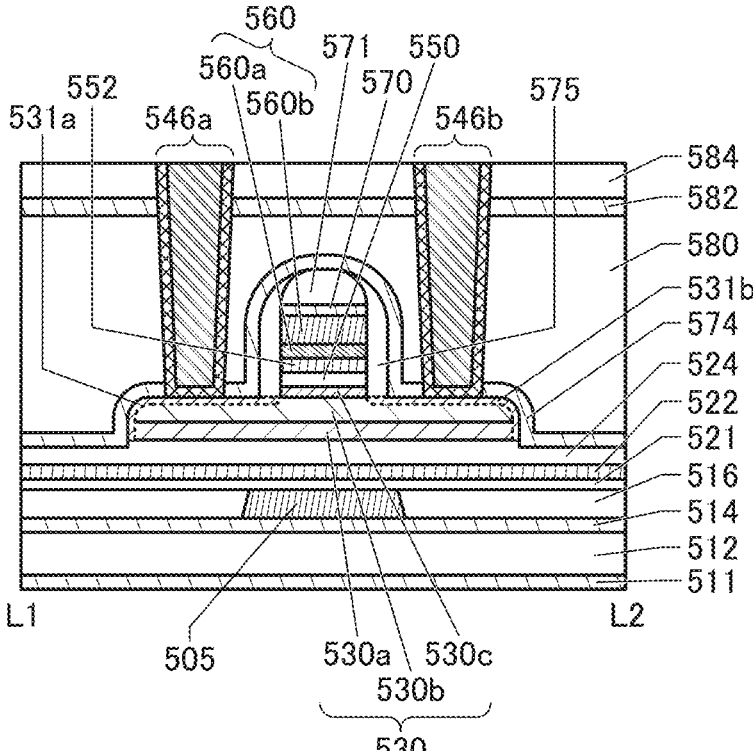

510E

510F 540a    546a    550    W2    560    530c    546b    540b

L1 —————————————————— L2

505    W1

582    560    550    516
584    524    514
W2

530c    574    505
530b    580    522
530    530a 576a    560    576b
540a    546a    550    560b    546b    540b
560a 584
582
580
574
524
522
516
514

L1    L2

505    530c    521
530b
530a    530

LOGIC CIRCUIT FORMED USING UNIPOLAR TRANSISTOR, AND SEMICONDUCTOR DEVICE

TECHNICAL FIELD

One embodiment of the present invention relates to a logic circuit formed using a unipolar transistor.

One embodiment of the present invention relates to a semiconductor device. In this specification and the like, a semiconductor device refers to all devices that can function by utilizing semiconductor characteristics. For example, an integrated circuit, a chip including an integrated circuit, an electronic component including a packaged chip, and an electronic device including an integrated circuit are examples of a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

As a circuit that processes a digital signal expressed as a high level or a low level (sometimes also denoted by High or Low, H or L, 1 or 0, or the like) (such a circuit is also referred to as a digital circuit or a logic circuit), a CMOS (Complementary Metal Oxide Semiconductor) circuit is widely used.

In many cases, a high power supply potential and a low power supply potential are supplied to a logic circuit; the high power supply potential is used for expressing a high level and the low power supply potential is used for expressing a low level. In addition, a CMOS circuit is formed using an n-channel transistor and a p-channel transistor that are formed on a single crystal silicon substrate, for example.

The CMOS circuit has a circuit configuration in which an n-channel transistor and a p-channel transistor are connected in series between a high power supply potential and a low power supply potential. The p-channel transistor is in a non-conduction state when the n-channel transistor is in a conduction state, and the p-channel transistor is in a conduction state when the n-channel transistor is in a non-conduction state. That is, the CMOS circuit has a feature that a shoot-through current (except for an off-state current or the like of a transistor) does not flow from the high power supply potential to the low power supply potential after a potential is determined to be a high level or a low level.

Here, in the case where both an n-channel transistor and a p-channel transistor cannot be manufactured or in the case where a reduction in manufacturing steps of a transistor is required for cost reduction, a logic circuit is formed using only one of an n-channel transistor and a p-channel transistor (also referred to as a unipolar transistor or a single-channel transistor) in some cases.

For example, Patent Document 1 and Patent Document 2 disclose examples of a semiconductor device that is formed using a unipolar transistor and a driver circuit of a display device. In Patent Document 1 and Patent Document 2, the circuit has a configuration in which two unipolar transistors are connected in series between a high power supply potential and a low power supply potential; a first signal and a second signal with the inverted logic (a high level or a low level) of the first signal are input to a gate of each transistor; and a shoot-through current does not flow from the high power supply potential to the low power supply potential. A method using the first signal and the second signal with the inverted logic of the first signal is referred to as a dual rail in some cases.

Furthermore, Patent Document 1 and Patent Document 2 solve a problem that one of a high level and a low level of an output signal does not reach the high power supply potential or the low power supply potential by providing a capacitor between an output terminal and a gate of one of the transistors. The method providing the capacitor between the output terminal and the gate of one of the transistors is referred to as bootstrapping in some cases.

Meanwhile, a transistor including a metal oxide in a channel formation region (also referred to as an oxide semiconductor transistor or an OS transistor) has been attracting attention in recent years. As the OS transistor, an n-channel transistor has been in practical use, and for example, the OS transistor has the following features: it has an extremely low off-state current; a high voltage can be applied between a source and a drain (that is, it has a high withstand voltage); and it can be stacked because it is a thin film transistor. Furthermore, the OS transistor has the following features: an off-state current is less likely to be increased even in a high-temperature environment; and the ratio of an on-state current to an off-state current is high even in a high-temperature environment, and thus a semiconductor device formed using an OS transistor has high reliability.

For example, Patent Document 3 discloses a semiconductor device including a plurality of memory cells using OS transistors over a semiconductor substrate where peripheral circuits such as a driver circuit and a control circuit are formed, and an example in which an OS transistor is used in a memory cell of a DRAM (Dynamic Random Access Memory). For example, a peripheral circuit can be formed using a Si transistor formed on a single crystal silicon substrate and a memory cell using an OS transistor can be stacked thereabove. Providing a memory cell using an OS transistor over a single crystal silicon substrate where a peripheral circuit is formed can reduce the chip area. In addition, an OS transistor has an extremely low off-state current, and thus enables long-term retention of stored data.

REFERENCE

Patent Document

[Patent Document 1] Japanese Published Patent Application No. H09-246936
[Patent Document 2] Japanese Published Patent Application No. 2002-328643
[Patent Document 3] Japanese Published Patent Application No. 2012-256820

SUMMARY OF THE INVENTION

Problems to be Solved by the Invention

Patent Document 1 and Patent Document 2 disclose a circuit that is a logic circuit employing a dual rail and bootstrapping and is formed using a unipolar transistor; the circuit has a feature that, like a CMOS circuit, a shoot-through current does not flow from the high power supply potential to the low power supply potential (it can be rephrased as a steady-state current does not flow) after a potential is determined to be a high level or a low level, and the high power supply potential can be used for expressing a high level and the low power supply potential can be used for expressing a low level.

Here, in a transistor provided with a capacitor between a source and a gate in a bootstrap circuit, a sufficient gate voltage Vgs with respect to the source of the transistor is preferably ensured. When the gate voltage Vgs with respect to the source of the transistor is not ensured sufficiently, a high level does not increase up to the high power supply potential or a low level does not decrease up to the low power supply potential in some cases.

In Patent Document 1 and Patent Document 2, the source of the transistor is electrically connected to the output terminal and the capacitor is provided between the source and the gate of the transistor. In the case where a capacitive load is connected to the output terminal, for example, a potential of the output terminal does not increase up to the high power supply potential when the output is at a high level, or a potential of the output terminal does not decrease up to the low power supply potential when the output is at a low level in some cases.

An object of one embodiment of the present invention is to provide a logic circuit formed using a unipolar transistor, in which a steady-state current does not flow, a potential of an output terminal increases up to a high power supply potential when the output is at a high level, and a potential of the output terminal decreases up to a low power supply potential when the output is at a low level. Alternatively, an object of one embodiment of the present invention is to provide a semiconductor device formed using a unipolar transistor, in which a steady-state current does not flow, a potential of an output terminal increases up to a high power supply potential when the output is at a high level, and a potential of the output terminal decreases up to a low power supply potential when the output is at a low level.

Note that one embodiment of the present invention does not necessarily achieve all the above objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a semiconductor device including first to fourth transistors, first and second capacitors, first and second wirings, first and second input terminals, and an output terminal. One of a source and a drain of the fourth transistor is electrically connected to the first wiring; the other of the source and the drain of the fourth transistor is electrically connected to one of a source and a drain of the second transistor, one terminal of the second capacitor, and a gate of the third transistor; and the other of the source and the drain of the second transistor is electrically connected to the second wiring. A gate of the fourth transistor is electrically connected to the first input terminal, one terminal of the first capacitor, and a gate of the first transistor; and a gate of the second transistor is electrically connected to the second input terminal. One of a source and a drain of the first transistor is electrically connected to the first wiring; the other of the source and the drain of the first transistor is electrically connected to the other terminal of the first capacitor, the other terminal of the second capacitor, one of a source and a drain of the third transistor, and the output terminal; and the other of the source and the drain of the third transistor is electrically connected to the second wiring.

In the above embodiment, a first potential is supplied to the first wiring, a second potential is supplied to the second wiring, the second potential is a potential higher than the first potential, a first signal is input to the first input terminal, a second signal is input to the second input terminal, and the second signal is a signal with an inverted logic of the first signal.

In the above embodiment, the first to fourth transistors are each an n-channel transistor.

In the above embodiment, the first to fourth transistors each include a metal oxide in a channel formation region.

Another embodiment of the present invention is a semiconductor device including first to third transistors, first and second capacitors, first and second wirings, first and second input terminals, and an output terminal. One of a source and a drain of the second transistor is electrically connected to the second input terminal; the other of the source and the drain of the second transistor is electrically connected to one terminal of the second capacitor and a gate of the third transistor; and a gate of the second transistor is electrically connected to the second wiring. One of a source and a drain of the first transistor is electrically connected to the first wiring; a gate of the first transistor is electrically connected to the first input terminal and one terminal of the first capacitor; the other of the source and the drain of the first transistor is electrically connected to the other terminal of the first capacitor, the other terminal of the second capacitor, one of a source and a drain of the third transistor, and the output terminal; and the other of the source and the drain of the third transistor is electrically connected to the second wiring.

In the above embodiment, a first potential is supplied to the first wiring, a second potential is supplied to the second wiring, the second potential is a potential higher than the first potential, a first signal is input to the first input terminal, a second signal is input to the second input terminal, and the second signal is a signal with an inverted logic of the first signal.

In the above embodiment, the first to third transistors are each an n-channel transistor.

In the above embodiment, the first to third transistors each include a metal oxide in a channel formation region.

Another embodiment of the present invention is a semiconductor device including first to seventh transistors, first to third capacitors, first and second wirings, first to fourth input terminals, and an output terminal. One of a source and a drain of the sixth transistor is electrically connected to the first wiring; the other of the source and the drain of the sixth transistor is electrically connected to one of a source and a drain of the seventh transistor; the other of the source and the drain of the seventh transistor is electrically connected to one of a source and a drain of the third transistor, one of a source and a drain of the fourth transistor, one terminal of the third capacitor, and a gate of the fifth transistor; and the other of the source and the drain of the third transistor and the other of the source and the drain of the fourth transistor are electrically connected to the second wiring. A gate of the sixth transistor is electrically connected to the second input terminal, one terminal of the second capacitor, and a gate of the first transistor; a gate of the seventh transistor is electrically connected to the first input terminal, one terminal of the first capacitor, and a gate of the second transistor; a gate of the third transistor is electrically connected to the third input terminal; and a gate of the fourth transistor is electrically connected to the fourth input terminal. One of a source and a drain of the first transistor is electrically connected to the first wiring; the other of the source and the drain of the first transistor is electrically connected to one of a source and a drain of the second transistor; the other of the source and the drain of the second transistor is electrically connected to the other terminal of the first capacitor, the other terminal of the second capacitor, the other terminal of the third capacitor, one of a source and a drain of the fifth transistor, and the output terminal; and the other of the source and the drain of the fifth transistor is electrically connected to the second wiring.

In the above embodiment, a first potential is supplied to the first wiring, a second potential is supplied to the second wiring, the second potential is a potential higher than the first potential, a first signal is input to the first input terminal, a second signal is input to the second input terminal, a third signal is input to the third input terminal, a fourth signal is input to the fourth input terminal, the third signal is a signal with an inverted logic of the first signal, and the fourth signal is a signal with an inverted logic of the second signal.

In the above embodiment, the first to seventh transistors are each an n-channel transistor.

In the above embodiment, the first to seventh transistors each include a metal oxide in a channel formation region.

Another embodiment of the present invention is a semiconductor device including first to seventh transistors, first to third capacitors, first and second wirings, first to fourth input terminals, and an output terminal. One of a source and a drain of the sixth transistor and one of a source and a drain of the seventh transistor are electrically connected to the first wiring; the other of the source and the drain of the sixth transistor is electrically connected to the other of the source and the drain of the seventh transistor, one of a source and a drain of the third transistor, one terminal of the third capacitor, and a gate of the fifth transistor; the other of the source and the drain of the third transistor is electrically connected to one of a source and a drain of the fourth transistor; and the other of the source and the drain of the fourth transistor is electrically connected to the second wiring. A gate of the sixth transistor is electrically connected to the first input terminal, one terminal of the first capacitor, and a gate of the first transistor; a gate of the seventh transistor is electrically connected to the second input terminal, one terminal of the second capacitor, and a gate of the second transistor; a gate of the third transistor is electrically connected to the third input terminal; and a gate of the fourth transistor is electrically connected to the fourth input terminal. One of a source and a drain of the first transistor and one of a source and a drain of the second transistor are electrically connected to the first wiring; the other of the source and the drain of the first transistor is electrically connected to the other of the source and the drain of the second transistor, the other terminal of the first capacitor, the other terminal of the second capacitor, the other terminal of the third capacitor, one of a source and a drain of the fifth transistor, and the output terminal; and the other of the source and the drain of the fifth transistor is electrically connected to the second wiring.

In the above embodiment, a first potential is supplied to the first wiring, a second potential is supplied to the second wiring, the second potential is a potential higher than the first potential, a first signal is input to the first input terminal, a second signal is input to the second input terminal, a third signal is input to the third input terminal, a fourth signal is input to the fourth input terminal, the third signal is a signal with an inverted logic of the first signal, and the fourth signal is a signal with an inverted logic of the second signal.

In the above embodiment, the first to seventh transistors are each an n-channel transistor.

In the above embodiment, the first to seventh transistors each include a metal oxide in a channel formation region.

Effect of the Invention

According to one embodiment of the present invention, a logic circuit formed using a unipolar transistor can be provided in which a steady-state current does not flow, the potential of the output terminal increases up to the high power supply potential when the output is at a high level, and the potential of the output terminal decreases up to the low power supply potential when the output is at a low level. Alternatively, according to one embodiment of the present invention, a semiconductor device formed using a unipolar transistor can be provided in which a steady-state current does not flow, the potential of the output terminal increases up to the high power supply potential when the output is at a high level, and the potential of the output terminal decreases up to the low power supply potential when the output is at a low level.

Note that the descriptions of the effects do not preclude the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 14A, FIG. 14B, and FIG. 14C are cross-sectional views showing structure examples of transistors.

FIG. 17A is a top view illustrating a structure example of a transistor. FIG. 17B and FIG. 17C are cross-sectional views illustrating the structure example of the transistor.

FIG. 18A is a top view illustrating a structure example of a transistor. FIG. 18B and FIG. 18C are cross-sectional views illustrating the structure example of the transistor.

MODE FOR CARRYING OUT THE INVENTION

Figure 1A:
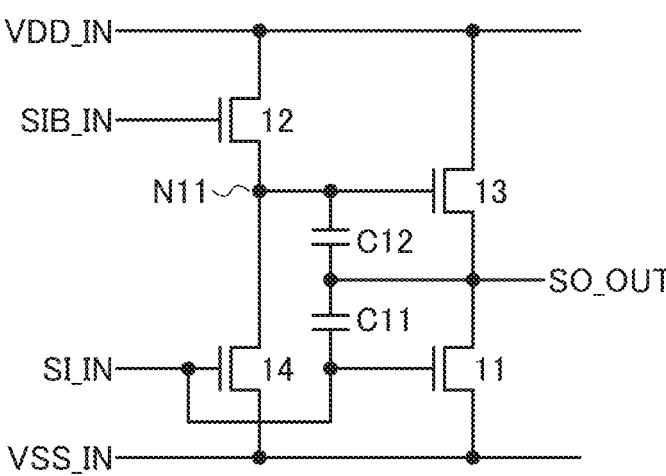
FIG. 1A and FIG. 1B are circuit diagrams each showing a configuration example of a semiconductor device.

Hereinafter, embodiments will be described with reference to the drawings. However, the embodiments can be implemented with many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, the size, the layer thickness, or the region is not necessarily limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitor" has a structure in which two electrodes face each other with an insulator (dielectric) therebetween. This specification and the like include a case where a "capacitor element" is the above-described "capacitor". That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a gate, a drain, and a source. In addition, a channel formation region is included between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Thus, the terms of a source and a drain are interchangeable for use in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the gate voltage Vgs with respect to a source is lower than a threshold voltage Vth, and the off state of a p-channel transistor refers to a state where the gate voltage Vgs with respect to a source is higher than the threshold voltage Vth.

That is, the off-state current of an n-channel transistor sometimes refers to a drain current at the time when the gate voltage Vgs with respect to a source is lower than the threshold voltage Vth.

In the above description of the off-state current, the drain may be replaced with the source. That is, the off-state current sometimes refers to a source current when a transistor is in an off state. In addition, a leakage current sometimes expresses the same meaning as the off-state current. Furthermore, in this specification and the like, the off-state current sometimes refers to a current that flows between a source and a drain when a transistor is in an off state.

Furthermore, in this specification and the like, an on-state current sometimes refers to a current that flows between a source and a drain when a transistor is in an on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is, in the case where a metal oxide has at least one of an amplifying function, a rectifying function, and a switching function, the metal oxide can be referred to as a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a semiconductor device of one embodiment of the present invention are described. The semiconductor device of one embodiment of the present invention is a logic circuit formed using a unipolar transistor, in which a high power supply potential is used for expressing a high level and a low power supply potential is used for expressing a low level.

For the semiconductor device described in this specification and the like, examples of using an n-channel transistor are shown, but a p-channel transistor can also be used. Change from an n-channel transistor to a p-channel transistor can be easily understood by those skilled in the art, and thus the description is omitted.

<Configuration Example 1 of Semiconductor Device>

FIG. 1A is a circuit diagram showing a configuration example of a semiconductor device 10. The semiconductor device 10 is a semiconductor device of one embodiment of the present invention and includes a transistor 11 to a transistor 14, a capacitor C11, and a capacitor C12. The transistor 11 to the transistor 14 are n-channel transistors.

The semiconductor device 10 includes a wiring VSS_IN to which a low power supply potential VSS is supplied, a wiring VDD_IN to which a high power supply potential VDD is supplied, an input terminal SI_IN to which a signal SI is input, an input terminal SIB_IN to which a signal SIB is input, and an output terminal SO_OUT from which a signal SO is output.

Here, the high power supply potential VDD is a potential higher than the low power supply potential VSS, and the low power supply potential VSS may be a reference potential in the semiconductor device 10. In addition, the signal SI and the signal SIB are digital signals; a potential expressing a high level of each of the signal SI and the signal SIB is the high power supply potential VDD, and a potential expressing a low level is the low power supply potential VSS. Moreover, the signal SIB is a signal with the inverted logic of the signal SI.

In the semiconductor device 10, one of a source and a drain of the transistor 14 is electrically connected to the wiring VSS_IN; the other of the source and the drain of the transistor 14 is electrically connected to one of a source and a drain of the transistor 12, one terminal of the capacitor C12, and a gate of the transistor 13; and the other of the source and the drain of the transistor 12 is electrically connected to the wiring VDD_IN.

A gate of the transistor 14 is electrically connected to the input terminal SI_IN, one terminal of the capacitor C11, and a gate of the transistor 11, and a gate of the transistor 12 is electrically connected to the input terminal SIB_IN.

One of a source and a drain of the transistor 11 is electrically connected to the wiring VSS_IN; the other of the source and the drain of the transistor 11 is electrically connected to the other terminal of the capacitor C11, the other terminal of the capacitor C12, one of a source and a drain of the transistor 13, and the output terminal SO_OUT; and the other of the source and the drain of the transistor 13 is electrically connected to the wiring VDD_IN.

Here, a connection point of the other of the source and the drain of the transistor 14, the one of the source and the drain of the transistor 12, the one terminal of the capacitor C12, and the gate of the transistor 13 is referred to a node N11.

<Configuration Example 2 of Semiconductor Device>

Figure 1B:
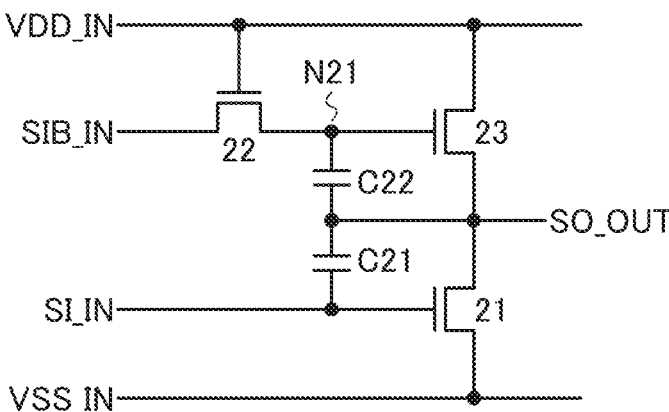

FIG. 1B is a circuit diagram showing a configuration example of a semiconductor device 20. The semiconductor device 20 is a semiconductor device of one embodiment of the present invention, and the configuration example is different from that of the semiconductor device 10. The semiconductor device 20 includes a transistor 21 to a transistor 23, a capacitor C21, and a capacitor C22. The transistor 21 to the transistor 23 are n-channel transistors.

Like the semiconductor device 10, the semiconductor device 20 includes the wiring VSS_IN to which the low power supply potential VSS is supplied, the wiring VDD_IN to which the high power supply potential VDD is supplied, the input terminal SI_IN to which the signal SI is input, the input terminal SIB_IN to which the signal SIB is input, and the output terminal SO_OUT from which the signal SO is output. Note that descriptions of the potentials and the signals are omitted to avoid repeated descriptions.

In the semiconductor device 20, one of a source and a drain of the transistor 22 is electrically connected to the input terminal SIB_IN, the other of the source and the drain of the transistor 22 is electrically connected to one terminal of the capacitor C22 and a gate of the transistor 23, and a gate of the transistor 22 is electrically connected to the wiring VDD_IN.

One of a source and a drain of the transistor 21 is electrically connected to the wiring VSS_IN; a gate of the transistor 21 is electrically connected to the input terminal SI_IN and one terminal of the capacitor C21; the other of the source and the drain of the transistor 21 is electrically connected to the other terminal of the capacitor C21, the other terminal of the capacitor C22, one of a source and a drain of the transistor 23, and the output terminal SO_OUT; and the other of the source and the drain of the transistor 23 is electrically connected to the wiring VDD_IN.

Here, a connection point of the other of the source and the drain of the transistor 22, the one terminal of the capacitor C22, and the gate of the transistor 23 is referred to as a node N21.

<Operation Example 1 of Semiconductor Device>

Figure 2:
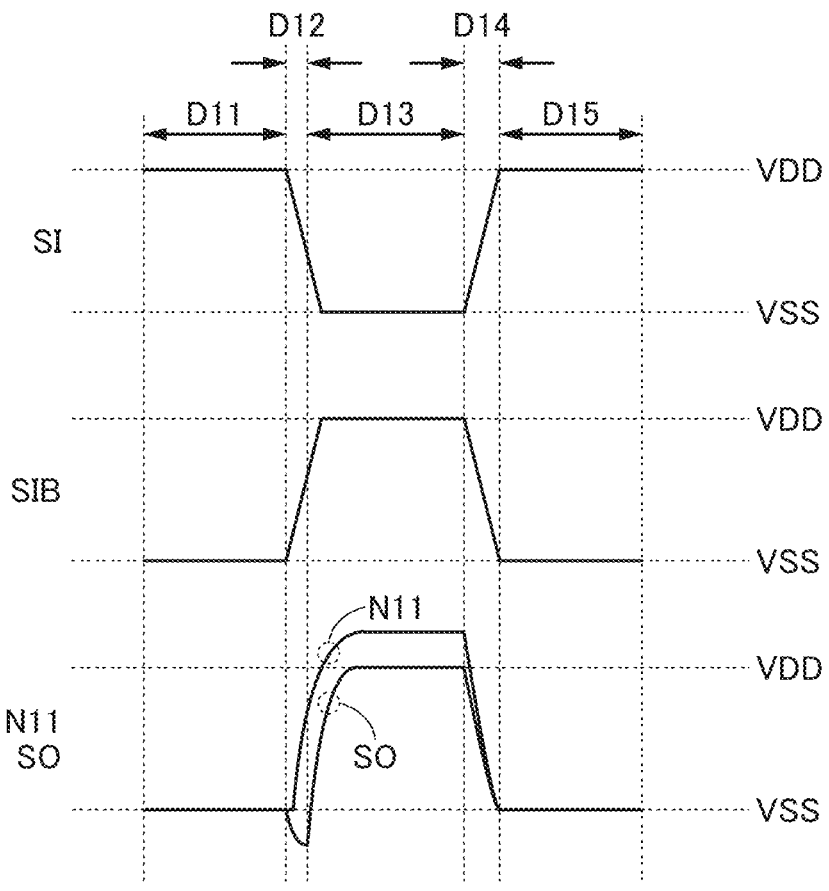
FIG. 2 is a timing chart.

FIG. 2 shows timing charts showing an operation example of the semiconductor device 10. FIG. 2 shows potentials of the signal SI, the signal SIB, the node N11, and the signal SO in each of a period D11 to a period D15. Note that threshold voltages of the transistor 11 to the transistor 14 are each the threshold voltage Vth.

The period D11 is a period in which the signal SI is at a high level and the signal SIB is at a low level. Since the signal SI is at a high level, the transistor 11 and the transistor 14 are in a conduction state and the node N11 and the signal SO are at a low level. In addition, the transistor 12 and the transistor 13 are in a non-conduction state.

The period D12 is part of a period in which the signal SI changes from a high level to a low level and the signal SIB changes from a low level to a high level (a period in which a signal changes from a high level to a low level is also referred to as a falling period, and a period in which a signal changes from a low level to a high level is also referred to as a rising period).

In the period D12, because of capacitive coupling due to the capacitor C11, the signal SO becomes a potential lower than a low level (the low power supply potential VSS) in accordance with the change of the signal SI from a high level to a low level. In addition, when the signal SIB increases from a low level and a potential difference between the signal SIB and the node N11 exceeds the threshold voltage Vth of the transistor 12, the transistor 12 is brought into a conduction state and the potential of the node N11 increases from a low level. When the potential of the node N11 increases from a low level, the transistor 13 is also brought into a conduction state; thus, the degree of the decrease in the potential of the signal SO from a low level is weaken and the potential of the signal SO begins to increase in the period D13 described below.

The period D13 includes part of a period in which the signal SI falls, a period in which the signal SI is at a low level, part of a period in which the signal SIB rises, and a period in which the signal SIB is at a high level. In the period D13, the transistor 12 and the transistor 13 are in a conduction state, the potential of the node N11 increases, and the potential of the signal SO which has become a potential lower than a low level also begins to increase. In addition, the transistor 11 and the transistor 14 are brought into a non-conduction state.

Although the potentials of the node N11 and the signal SO increase in the period D13, there is a potential difference generated between the node N11 and the signal SO since the signal SO increases from a potential lower than a low level. In addition, when the signal SIB becomes a high level to increase the potential of the node N11 and a potential difference between the signal SIB and the node N11 becomes smaller than the threshold voltage Vth of the transistor 12, the transistor 12 is brought into a non-conduction state. Although the transistor 12 is bought into a non-conduction state, the potential of the node N11 further increases in accordance with the potential increase of the signal SO, because of capacitive coupling due to the capacitor C12. That is, owing to the potential difference between the node N11 and the signal SO, the potential of the node N11 can be surely increased.

Since the potential of the node N11 increases exceeding the high power supply potential VDD, the transistor 13 is not brought into a non-conduction state even when a potential difference between the signal SO and the high power supply potential VDD becomes smaller than the threshold voltage Vth of the transistor 13. The signal SO increases until it becomes equal to the high power supply potential VDD.

The period D14 is a period in which the signal SI rises and the signal SIB falls. In the period D14, the transistor 11 and the transistor 14 are brought into a conduction state and the transistor 12 and the transistor 13 are brought into a non-conduction state. That is, the node N11 and the signal SO become a low level.

The period D15 is a period in which the signal SI is at a high level and the signal SIB is at a low level. Since period D15 is similar to the period D11, the description is omitted.

As described above, the semiconductor device 10 is a logic circuit formed using an n-channel transistor, in which the signal SO output from the output terminal SO_OUT increases up to the high power supply potential VDD when the output is at a high level, and decreases up to the low power supply potential VSS when the output is at a low level. In addition, the semiconductor device 10 has a feature that a shoot-through current does not flow from the high power supply potential VDD to the low power supply potential VSS after the potentials of the signal SI and the signal SIB are each determined to a high level or a low level.

<Operation Example 2 of Semiconductor Device>

Figure 3:
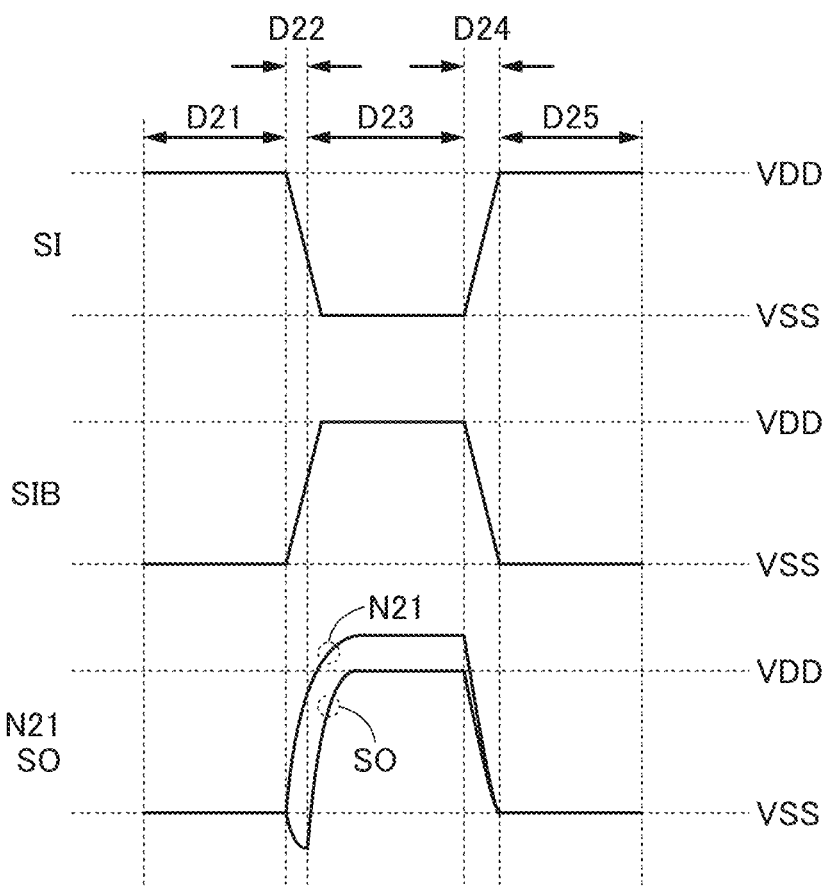
FIG. 3 is a timing chart.

FIG. 3 shows timing charts showing an operation example of the semiconductor device 20. FIG. 3 shows the potentials of the signal SI, the signal SIB, the node N21, and the signal SO in each of a period D21 to a period D25. Note that threshold voltages of the transistor 21 to the transistor 23 are each the threshold voltage Vth.

The period D21 is a period in which the signal SI is at a high level and the signal SIB is at a low level. Since the signal SI is at a high level, the transistor 21 is in a conduction state and the signal SO is at a low level. In addition, transistor 22 is in a conduction state and the potential of the node N21 is at a low level like the signal SIB. Thus, the transistor 23 is in a non-conduction state. The period D22 is part of a period in which the signal SI changes from a high level to a low level and the signal SIB changes from a low level to a high level.

In the period D22, because of capacitive coupling due to the capacitor C21, the signal SO becomes a potential lower than a low level in accordance with the change of the signal SI from a high level to a low level. In addition, the signal SIB increases from a low level and the potential of the node N21 increases like the signal SIB. When the potential of the node N21 increases from a low level, the transistor 23 is brought into a conduction state; thus, the degree of the decrease in the potential of the signal SO from a low level is weaken and the potential of the signal SO begins to increase in the period D23 described below.

The period D23 includes part of a period in which the signal SI falls, a period in which the signal SI is at a low level, part of a period in which the signal SIB rises, and a period in which the signal SIB is at a high level. In the period D23, the potential of the node N21 increases, the transistor 23 is in a conduction state, and the potential of the signal SO which has become a potential lower than a low level also begins to increase. In addition, the transistor 21 is brought into a non-conduction state.

Although the potentials of the node N21 and the signal SO increase in the period D23, there is a potential difference generated between the node N21 and the signal SO since the signal SO increases from a potential lower than a low level. In addition, when the signal SIB becomes a high level to increase the potential of the node N21 and a potential difference between the node N21 and the high power supply potential VDD becomes smaller than the threshold voltage Vth of the transistor 22, the transistor 22 is brought into a non-conduction state. Although the transistor 22 is bought into a non-conduction state, the potential of the node N21 further increases in accordance with the potential increase of the signal SO, because of capacitive coupling due to the capacitor C22. That is, owing to the potential difference between the node N21 and the signal SO, the potential of the node N21 can be surely increased.

Since the potential of the node N21 increases exceeding the high power supply potential VDD, the transistor 23 is not brought into a non-conduction state even when a potential difference between the signal SO and the high power supply potential VDD becomes smaller than the threshold voltage Vth of the transistor 23. The signal SO increases until it becomes equal to the high power supply potential VDD.

The period D24 is a period in which the signal SI rises and the signal SIB falls. In the period D24, the transistor 21 is brought into a conduction state, the potential of the node N21 decreases, and the transistor 23 is brought into a non-conduction state. That is, the node N21 and the signal SO become a low level.

The period D25 is a period in which the signal SI is at a high level and the signal SIB is at a low level. Since the period D25 is similar to the period D21, the description is omitted.

As described above, the semiconductor device 20 is a logic circuit formed using an n-channel transistor, in which the signal SO output from the output terminal SO_OUT increases to the high power supply potential VDD when the output is at a high level, and decreases to the low power supply potential VSS when the output is at a low level. In addition, the semiconductor device 20 has a feature that a shoot-through current does not flow from the high power supply potential VDD to the low power supply potential VSS after the potentials of the signal SI and the signal SIB are each determined to a high level or a low level.

<Transistor Included in Semiconductor Device>

As each of the transistor 11 to the transistor 14 included in the semiconductor device 10 and the transistor 21 to the transistor 23 included in the semiconductor device 20, a transistor including a metal oxide in a channel formation region (OS transistor) can be used.

For example, the OS transistor has the following features: it has an extremely low off-state current, a high voltage can be applied between a source and a drain, and it can be stacked because it is a thin film transistor. Here, an off-state current refers to a drain current when a transistor is in an off state, and an oxide semiconductor has a bandgap of 2.5 eV or larger, preferably 3.0 eV or larger; thus, an OS transistor has features of a low leakage current due to thermal excitation and an extremely low off-state current. An off-state current per micrometer of channel width of an OS transistor can be, for example, lower than or equal to 100 zA/μm, lower than or equal to 10 zA/μm, lower than or equal to 1 zA/μm, or lower than or equal to 10 yA/μm.

A transistor with a low off-state current is preferably used particularly for the transistor 12, the transistor 14, and the transistor 22. In this case, the potential of the node N11 or the node N21 that increases exceeding the high power supply potential VDD can be retained for a long time even when a period in which the signal SI is at a low level (a period in which the signal SIB is at a high level) is long in the period D13 or the period D23.

Furthermore, an OS transistor has the following features: an off-state current is less likely to be increased even in a high-temperature environment, and the ratio of an on-state current to an off-state current is high even in a high-temperature environment. Forming the semiconductor device 10 or the semiconductor device 20 using an OS transistor can increase the reliability of the semiconductor device.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 3 and Embodiment 4.

Moreover, an OS transistor is a thin film transistor and thus can be provided to be stacked. For example, an OS transistor can be provided over a circuit formed using a Si transistor formed on a single crystal silicon substrate. Thus, the chip area of the semiconductor device 10 or the semiconductor device 20 can be reduced.

Alternatively, as each of the transistor 11 to the transistor 14 included in the semiconductor device 10 and the transistor 21 to the transistor 23 included in the semiconductor device 20, a transistor other than an OS transistor may be used. For example, a transistor including a semiconductor with a wide bandgap in a channel formation region can be used. The semiconductor with a wide bandgap refers to a semiconductor whose bandgap is larger than or equal to 2.2 eV in some cases, and examples thereof include silicon carbide, gallium nitride, and diamond.

Moreover, as each of the transistor 11 to the transistor 14 included in the semiconductor device 10 and the transistor 21 to the transistor 23 included in the semiconductor device 20, a transistor including a back gate may be used.

Figure 4A:
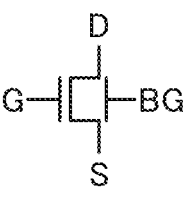
FIG. 4A and FIG. 4B are diagrams each showing a circuit symbol of a transistor.

As an example of a transistor including a back gate, FIG. 4A shows a circuit symbol of a transistor 31. The transistor 31 includes four terminals called a gate (also referred to as a front gate), a drain, a source, and a back gate. In FIG. 4A, the terminals are denoted by G (the gate), D (the drain), S (the source), and BG (the back gate).

As a usage example of the transistor 31, the back gate may be electrically connected to the gate, the back gate may be electrically connected to the source, a predetermined potential may be applied to the back gate, or the back gate may be brought into an electrically floating state (also referred to as floating). For example, electrical connection between the back gate and the gate can increase the on-state current of the transistor 31. In addition, application of a predetermined potential to the back gate can change the threshold voltage of the transistor 31. Cross-sectional structure examples of the transistor including a back gate will be described in Embodiment 3.

Alternatively, as each of the transistor 11 to the transistor 14 included in the semiconductor device 10 and the transistor 21 to the transistor 23 included in the semiconductor device 20, a transistor including a plurality of gates (also referred to as multi-gate) may be used.

Figure 4B:
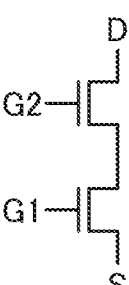

As an example of a transistor including a plurality of gates, FIG. 4B shows a circuit symbol of a transistor 32 including two gates (also referred to as double gate). The transistor 32 includes four terminals (a gate 1, a gate 2, a drain, and a source). In FIG. 4B, the terminals are denoted by G1 (the gate 1), G2 (the gate 2), D (the drain), and S (the source).

As a usage example of the transistor 32, the gate 1 and the gate 2 may be electrically connected to each other or a predetermined potential may be applied to the gate 1 or the gate 2. For example, electrical connection between the gate 1 and the gate 2 can reduce the off-state current of the transistor 32 in some cases. In addition, application of a predetermined potential to the gate 1 or the gate 2 enables the transistor 32 to be a transistor having a high withstand voltage in some cases.

Figure 4C:
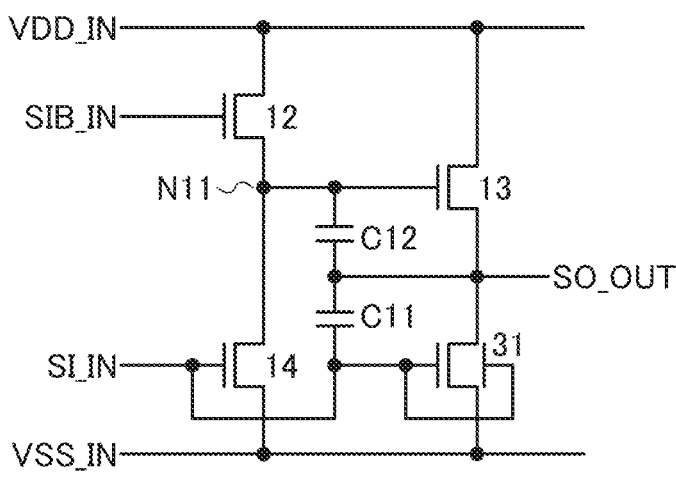
FIG. 4C and FIG. 4D are circuit diagrams each showing a configuration example of a semiconductor device.

FIG. 4C shows an example in which the transistor 31 including a back gate is used as the transistor 11 included in the semiconductor device 10, for example. In FIG. 4C, the back gate of the transistor 31 is electrically connected to the gate.

Figure 4D:
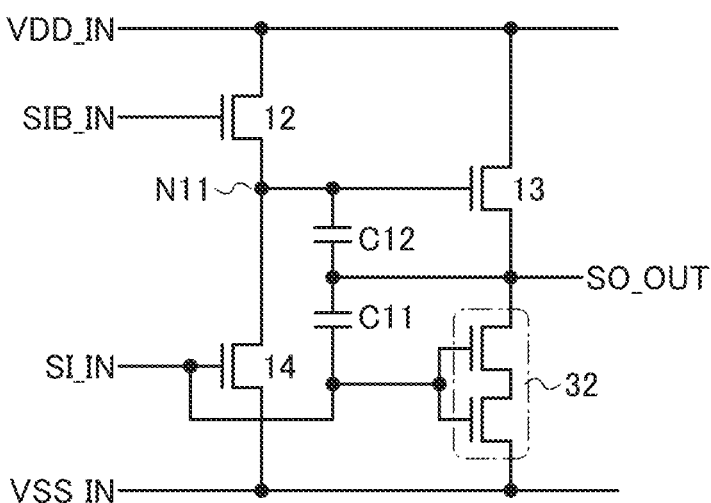

FIG. 4D shows an example in which the transistor 32 including two gates is used as the transistor 11 included in the semiconductor device 10, for example. In FIG. 4D, the gate 1 of the transistor 32 is electrically connected to the gate 2.

Note that this embodiment can be implemented in combination with the other embodiments described in this specification as appropriate.

Embodiment 2

This embodiment describes an example in which a general-purpose logic circuit is formed by application of the semiconductor device 10 described in the above embodiment. Note that in this specification and the like, in the case where the same components are included, a reference numeral such as "_1" or [_2] is sometimes used to differentiate the components (e.g., a semiconductor device 10_1 or a semiconductor device 10_2).

<NOT Circuit and Buffer Circuit>

Figure 5:
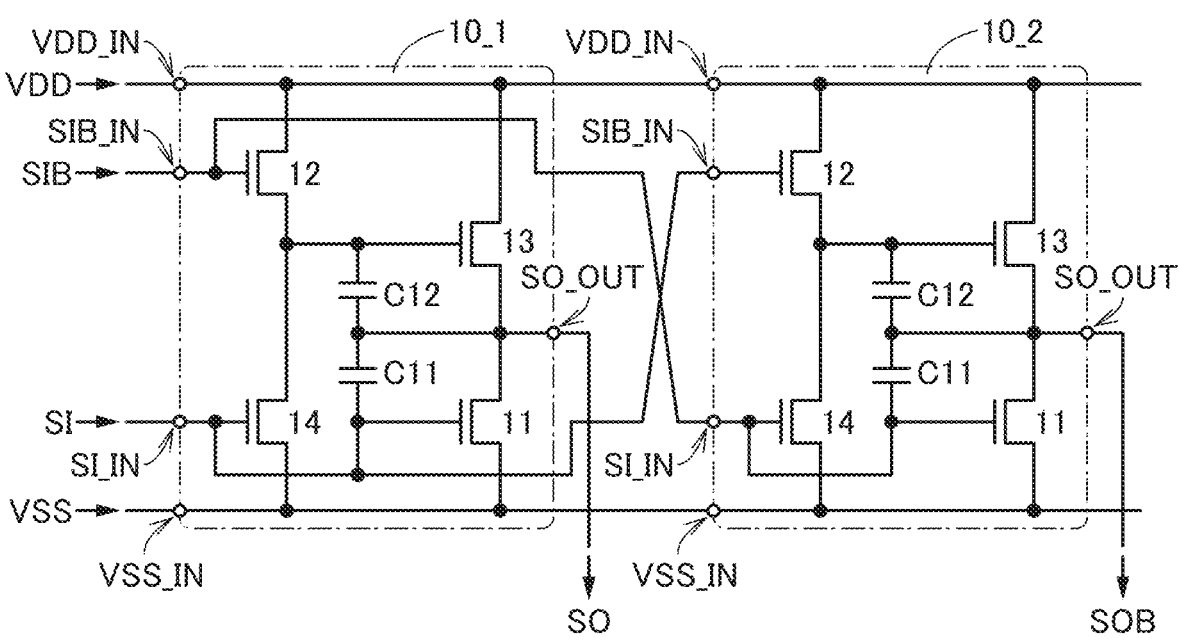
FIG. 5 is a circuit diagram showing a configuration example of a semiconductor device.

FIG. 5 is a circuit diagram showing a configuration example of a semiconductor device 30. The semiconductor device 30 includes two semiconductor devices 10 described in the above embodiment, and has a function of a NOT circuit inverting a logic or a buffer circuit not inverting a logic.

As illustrated in FIG. 5, the semiconductor device 30 includes the semiconductor device 10_1 and the semiconductor device 10_2. Note that for description, the semiconductor device 10_1 and the semiconductor device 10_2 are surrounded by dashed-dotted lines and input/output terminals are shown by circles provided on the dashed-dotted lines in FIG. 5. In addition, potentials and signals that are input or output are indicated using arrows provided on the extension of wirings.

As in the semiconductor device 10 described in the above embodiment, in the semiconductor device 10_1, the signal SI is input to the input terminal SI_IN, the signal SIB is input to the input terminal SIB_IN, and the signal SO is output from the output terminal SO_OUT. Meanwhile, in the semiconductor device 10_2, the signal SIB is input to the input terminal SI_IN and the signal SI is input to the input terminal SIB_IN. A signal SOB is output from the output terminal SO_OUT included in the semiconductor device 10_2.

Figure 6:
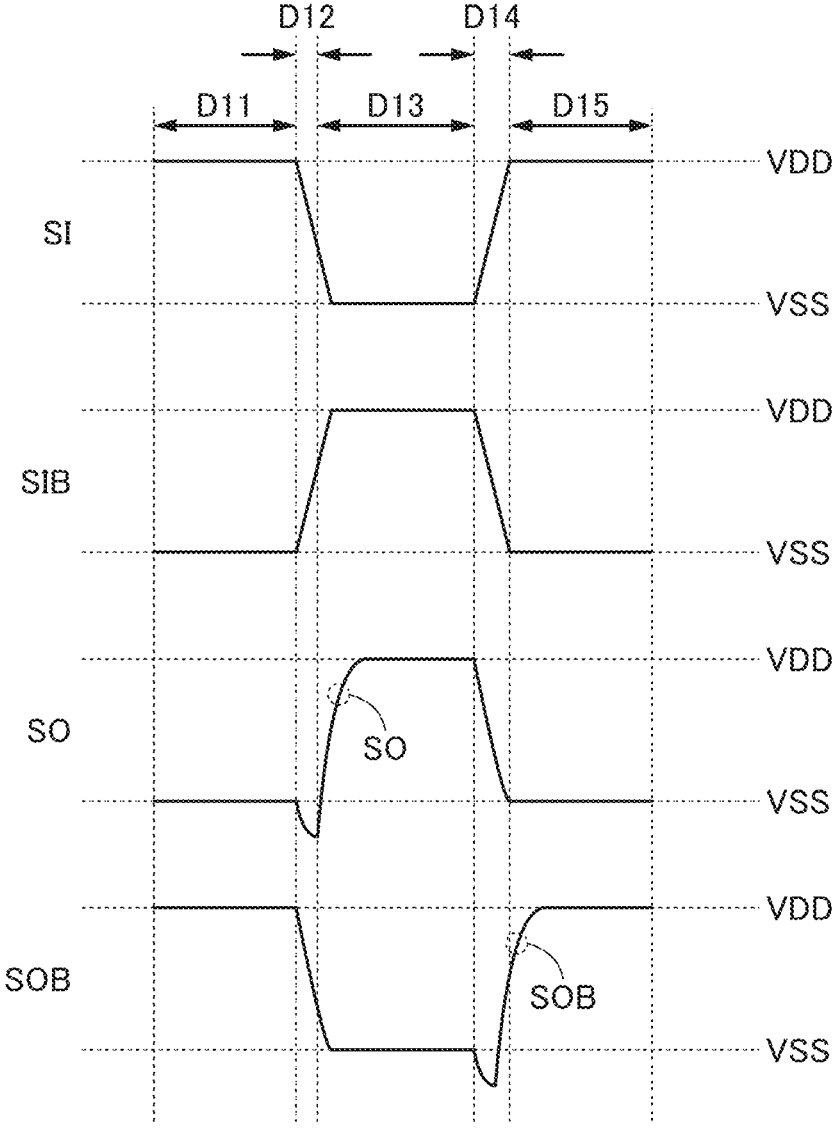
FIG. 6 is a timing chart.

Next, FIG. 6 shows timing charts showing an operation example of the semiconductor device 30. The timing charts of the signal SI, the signal SIB, and the signal SO are the same as those shown in FIG. 2, and a timing chart of the signal SOB is additionally shown in FIG. 6. To the semiconductor device 10_2 and the semiconductor device 10_1, the signal SI and the signal SIB are input in reverse, and thus the signal SOB is a signal with the inverted logic of the signal SO.

As described above, the signal SI and the signal SIB are input to the semiconductor device 30 and the semiconductor device 30 outputs the signal SO and the signal SOB. The signal SIB is a signal with the inverted logic of the signal SI and the signal SOB is a signal with the inverted logic of the signal SO; thus, the output terminal of the semiconductor device 30 can be electrically connected to an input terminal of another semiconductor device 30.

<Nand Circuit>

Figure 7A:
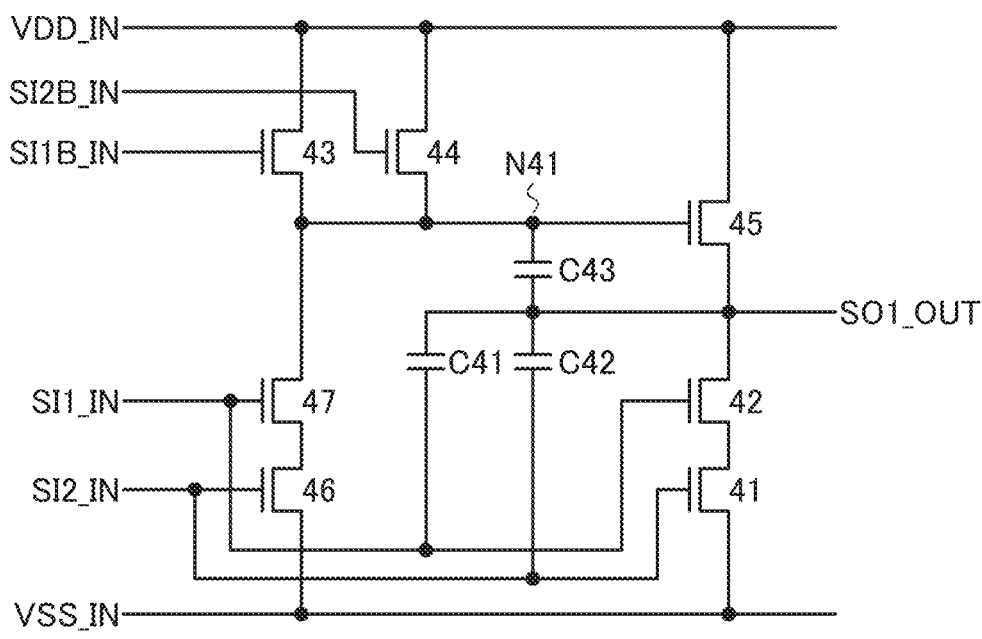
FIG. 7A and FIG. 7B are circuit diagrams each showing a configuration example of a semiconductor device.

FIG. 7A is a circuit diagram showing a configuration example of a semiconductor device 40. The semiconductor device 40 is a semiconductor device obtained by application of the semiconductor device 10 and has a function of a NAND circuit. The semiconductor device 40 includes a transistor 41 to a transistor 47 and a capacitor C41 to a capacitor C43. The transistor 41 to the transistor 47 are n-channel transistors.

The semiconductor device 40 includes the wiring VSS_IN to which the low power supply potential VSS is supplied, the wiring VDD_IN to which the high power supply potential VDD is supplied, an input terminal SI1_IN to which a signal SI1 is input, an input terminal SI2_IN to which a signal SI2 is input, an input terminal SI1B_IN to which a signal SI1B is input, an input terminal SI2B_IN to which a signal SI2B is input, and an output terminal SO1_OUT from which a signal SO1 is output.

Here, the high power supply potential VDD is a potential higher than the low power supply potential VSS, and the low power supply potential VSS may be a reference potential in the semiconductor device 40. In addition, the signal SI1, the signal SI2, the signal SI1B, and the signal SI2B are digital signals; a potential expressing a high level of each of the signal SI1, the signal SI2, the signal SI1B, and the signal SI2B is the high power supply potential VDD, and a potential expressing a low level is the low power supply potential VSS. Moreover, the signal SI1B is a signal with the inverted logic of the signal SI1 and the signal SI2B is a signal with the inverted logic of the signal SI2.

In the semiconductor device 40, one of a source and a drain of the transistor 46 is electrically connected to the wiring VSS_IN; the other of the source and the drain of the transistor 46 is electrically connected to one of a source and a drain of the transistor 47; the other of the source and the drain of the transistor 47 is electrically connected to one of a source and a drain of the transistor 43, one of a source and a drain of the transistor 44, one terminal of the capacitor C43, and a gate of the transistor 45; and the other of the source and the drain of the transistor 43 and the other of the source and the drain of the transistor 44 are electrically connected to the wiring VDD_IN.

A gate of the transistor 46 is electrically connected to the input terminal SI2_IN, one terminal of the capacitor C42, and a gate of the transistor 41; a gate of the transistor 47 is electrically connected to the input terminal SI1_IN, one terminal of the capacitor C41, and a gate of the transistor 42; a gate of the transistor 43 is electrically connected to the input terminal SI1B_IN; and a gate of the transistor 44 is electrically connected to the input terminal SI2B_IN.

One of a source and a drain of the transistor 41 is electrically connected to the wiring VSS_IN; the other of the source and the drain of the transistor 41 is electrically connected to one of a source and a drain of the transistor 42; the other of the source and the drain of the transistor 42 is electrically connected to the other terminal of the capacitor C41, the other terminal of the capacitor C42, the other terminal of the capacitor C43, one of a source and a drain of the transistor 45, and the output terminal SO1_OUT; and the other of the source and the drain of the transistor 45 is electrically connected to the wiring VDD_IN.

Here, a connection point of the other of the source and the drain of the transistor 47, the one of the source and the drain of the transistor 43, the one of the source and the drain of the transistor 44, the one terminal of the capacitor C43, and the gate of the transistor 45 is referred to a node N41. Note that an operation example of the semiconductor device 40 will be described later.

<NOR Circuit>

Figure 7B:
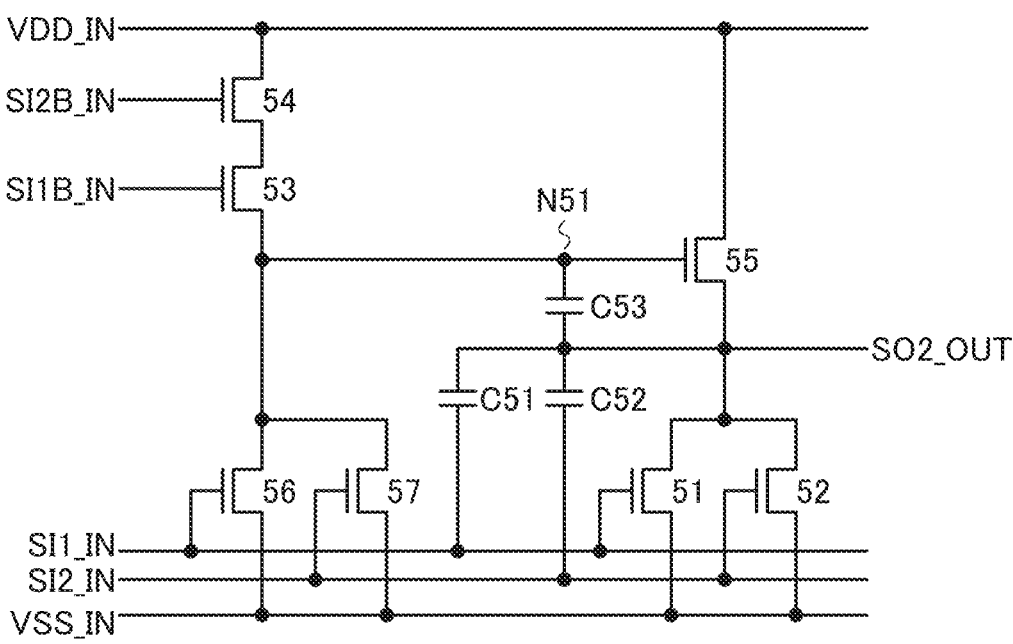

FIG. 7B is a circuit diagram showing a configuration example of a semiconductor device 50. The semiconductor device 50 is a semiconductor device obtained by application of the semiconductor device 10 and has a function of a NOR circuit. The semiconductor device 50 includes a transistor 51 to a transistor 57 and a capacitor C51 to a capacitor C53. The transistor 51 to the transistor 57 are n-channel transistors.

The semiconductor device 50 includes the wiring VSS_IN to which the low power supply potential VSS is supplied, the wiring VDD_IN to which the high power supply potential VDD is supplied, the input terminal SI1_IN to which the signal SI1 is input, the input terminal SI2_IN to which the signal SI2 is input, the input terminal SI1B_IN to which the signal SI1B is input, the input terminal SI2B_IN to which the signal SI2B is input, and an output terminal SO2_OUT from which a signal SO2 is output. Note that descriptions of the potentials and the signals are omitted to avoid repeated descriptions.

In the semiconductor device 50, one of a source and a drain of the transistor 56 and one of a source and a drain of the transistor 57 are electrically connected to the wiring VSS_IN; the other of the source and the drain of the transistor 56 is electrically connected to the other of the source and the drain of the transistor 57, one of a source and a drain of the transistor 53, one terminal of the capacitor C53, and a gate of the transistor 55; the other of the source and the drain of the transistor 53 is electrically connected to one of a source and a drain of the transistor 54; and the other of the source and the drain of the transistor 54 is electrically connected to the wiring VDD_IN.

A gate of the transistor 56 is electrically connected to the input terminal SI1_IN, one terminal of the capacitor C51, and a gate of the transistor 51; a gate of the transistor 57 is electrically connected to the input terminal SI2_IN, one terminal of the capacitor C52, and a gate of the transistor 52; a gate of the transistor 53 is electrically connected to the input terminal SI1B_IN; and a gate of the transistor 54 is electrically connected to the input terminal of the SI2B_IN.

One of a source and a drain of the transistor 51 and one of a source and a drain of the transistor 52 are electrically connected to the wiring VSS_IN; the other of the source and the drain of the transistor 51 is electrically connected to the other of the source and the drain of the transistor 52, the other terminal of the capacitor C51, the other terminal of the capacitor C52, the other terminal of the capacitor C53, one of a source and a drain of the transistor 55, and the output terminal SO2_OUT; and the other of the source and the drain of the transistor 55 is electrically connected to the wiring VDD_IN.

Here, a connection point of the other of the source and the drain of the transistor 56, the one of the source and the drain of the transistor 57, the one of the source and the drain of the transistor 53, the one terminal of the capacitor C53, and the gate of the transistor 55 is referred to a node N51.

<Operation Example of Semiconductor Device>

Figure 8:
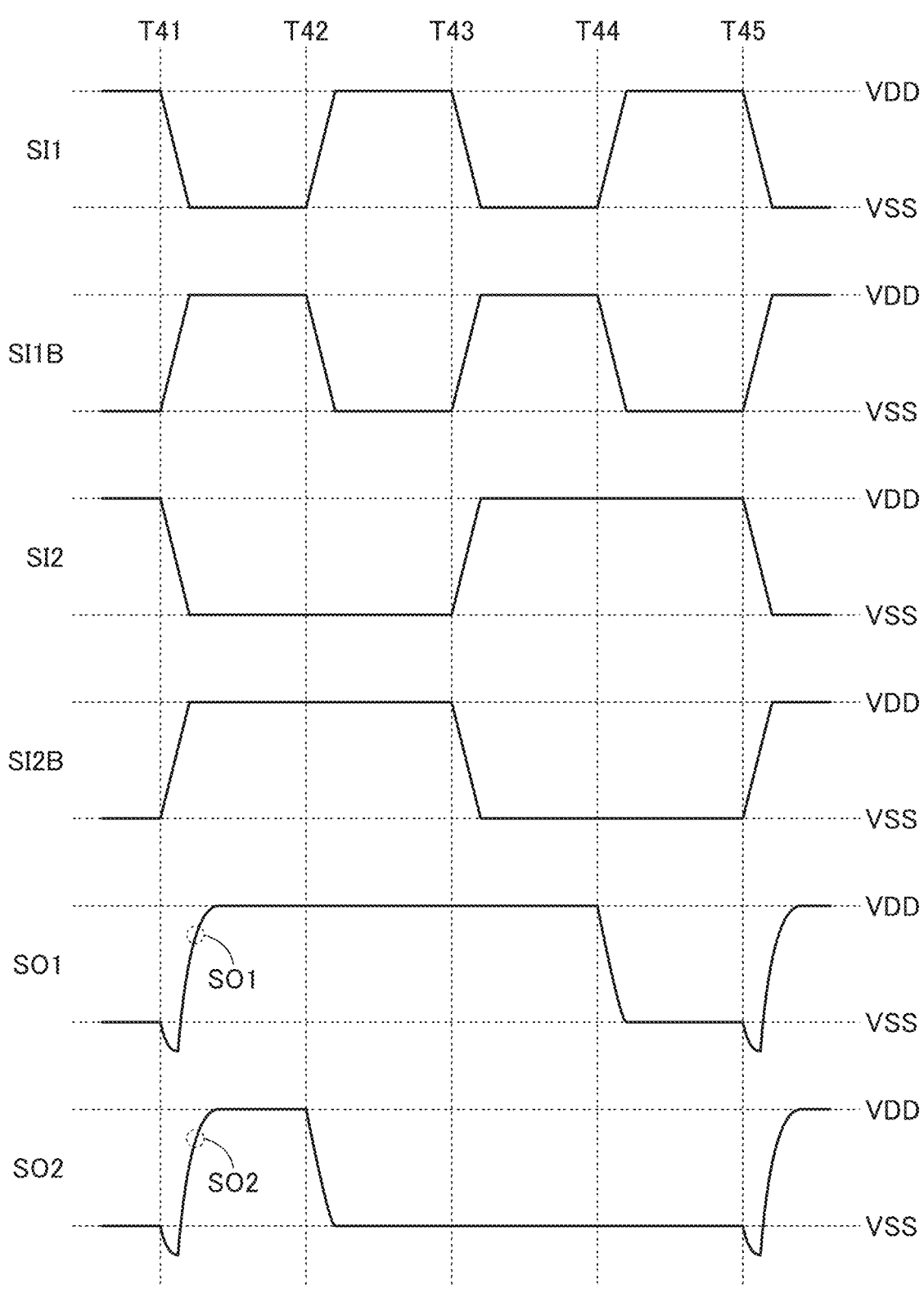
FIG. 8 is a timing chart.

FIG. 8 shows timing charts showing operation examples of the semiconductor device 40 and the semiconductor device 50. FIG. 8 shows the relationship between the potentials of the signal SI1, the signal SI2, the signal SI1B, and the signal SI2B and the potentials of the signal SO1 and the signal SO2. Note that time at which the potentials of the signal SI1, the signal SI2, the signal SI1B, and the signal SI2B begin to fall or begin to rise are denoted by Time T41 to Time T45.

At Time T41, the signal SI1 and the signal SI2 begin to change from a high level to a low level. Note that the signal SI1B is a signal with the inverted logic of the signal SI1 and the signal SI2B is a signal with the inverted logic of the signal SI2, and thus the descriptions are omitted.

In the semiconductor device 40, the transistor 41, the transistor 42, the transistor 46, and the transistor 47 begin to change from a conduction state to a non-conduction state, and the signal SO1 becomes a potential lower than a low level (the low power supply potential VSS) because of capacitive coupling due to the capacitor C41 and the capacitor C42. In addition, since the transistor 43 and the transistor 44 change from a non-conduction state to a conduction state, the potential of the node N41 increases from a low level and the transistor 45 is brought into a conduction state; accordingly, the potential of the signal SO1 begins to increase subsequently. Because of capacitive coupling due to the capacitor C43, the potential of the node N41 increases exceeding the high power supply potential VDD in accordance with the potential increase of the signal SO1, and the signal SO1 increases until it becomes equal to the high power supply potential VDD.

In the semiconductor device 50, the transistor 51, the transistor 52, the transistor 56, and the transistor 57 begin to change from a conduction state to a non-conduction state, and the signal SO2 becomes a potential lower than a low level because of capacitive coupling due to the capacitor C51 and the capacitor C52. In addition, since the transistor 53 and the transistor 54 change from a non-conduction state to a conduction state, the potential of the node N51 increases from a low level and the transistor 55 is brought into a conduction state; accordingly, the potential of the signal SO2 begins to increase subsequently. Because of capacitive coupling due to the capacitor C53, the potential of the node N51 increases exceeding the high power supply potential VDD in accordance with the potential increase of the signal SO2, and the potential of the signal SO2 increases until it becomes equal to the high power supply potential VDD.

At Time T42, the signal SI1 begins to change from a low level to a high level, and the signal SI2 remains at a low level.

In the semiconductor device 40, the transistor 42 and the transistor 47 begin to change from a non-conduction state to a conduction state, and the transistor 41 and the transistor 46 remain in a non-conduction state. In addition, the transistor 43 begins to change from a conduction state to a non-conduction state, and the transistor 44 remains in a conduction state. Thus, the potential of the node N41 remains at a high level and the potential of the signal SO1 remains the high power supply potential VDD.

In the semiconductor device 50, the transistor 52 and transistor 57 remain in a non-conduction state, and the transistor 51 and transistor 56 begin to change from a non-conduction state to a conduction state. In addition, the transistor 54 remains in a conduction state, and the transistor 53 begins to change from a conduction state to a non-conduction state. Thus, the potential of the node N51 decreases from a high level and the potential of the signal SO2 decreases from the high power supply potential VDD to the low power supply potential VSS.

At Time T43, the signal SI1 begins to change from a high level to a low level, and the signal SI2 begins to change from a low level to a high level.

In the semiconductor device 40, the transistor 42 and transistor 47 begin to change from a conduction state to a non-conduction state, and the transistor 41 and the transistor 46 begin to change from a non-conduction state to a conduction state. In addition, the transistor 43 begins to change from a non-conduction state to a conduction state, and the transistor 44 begins to change from a conduction state to a non-conduction state. Thus, the potential of the node N41 remains at a high level and the potential of the signal SO1 remains the high power supply potential VDD.

In the semiconductor device 50, the transistor 51 and the transistor 56 begin to change from a conduction state to a non-conduction state, and the transistor 52 and the transistor 57 begin to change from a non-conduction state to a conduction state. In addition, the transistor 53 begins to change from a non-conduction state to a conduction state, and the transistor 54 begins to change from a conduction state to a non-conduction state. Thus, the potential of the node N51 remains at a low level and the potential of the signal SO2 remains the low power supply potential VSS.

At Time T44, the signal SI1 begins to change from a low level to a high level, and the signal SI2 remains at a high level.

In the semiconductor device 40, the transistor 42 and the transistor 47 begin to change from a non-conduction state to a conduction state, and the transistor 41 and the transistor 46 remain in a conduction state. In addition, the transistor 43 begins to change from a conduction state to a non-conduction state and the transistor 44 remains in a non-conduction state. Thus, the potential of the node N41 decreases from a high level and the potential of the signal SO1 decreases from the high power supply potential VDD to the low power supply potential VSS.

In the semiconductor device 50, the transistor 51 and the transistor 56 begin to change from a non-conduction state to a conduction state, and the transistor 52 and the transistor 57 remain in a conduction state. In addition, the transistor 53 begins to change from a conduction state to a non-conduction state and the transistor 54 remains in a non-conduction state. Thus, the potential of the node N51 remains at a low level and the potential of the signal SO2 remains the low power supply potential VSS.

At Time T45, the signal SI1 and the signal SI2 begin to change from a high level to a low level. Since the changes of the signal SI1 and the signal SI2 at Time T45 is similar to those at Time T41, the description is omitted.

As described above, the signal SI1, the signal SI2, the signal SI1B, and the signal SI2B are input to the semiconductor device 40 and the semiconductor device 40 outputs the signal SO1. That is, the semiconductor device 40 has a function of a NAND circuit. In addition, the signal SI1, the signal SI2, the signal SI1B, and the signal SI2B are input to the semiconductor device 50 and the semiconductor device 50 outputs the signal SO2. That is, the semiconductor device 50 has a function of a NOR circuit.

<Configuration Example of Semiconductor Device>

The semiconductor device 40 and the semiconductor device 50 can be used in combination as in the semiconductor device 30 including two semiconductor devices 10.

Figure 9A:
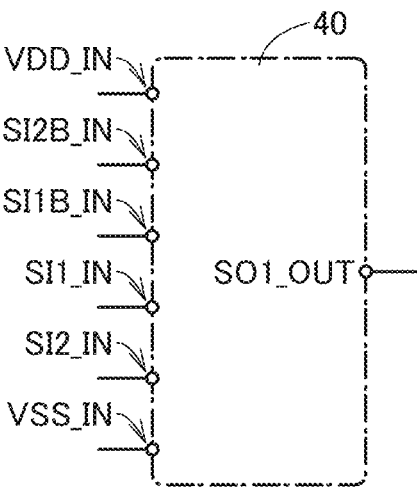
FIG. 9A and FIG. 9B are diagrams each showing symbols of a semiconductor device.
Figure 9B:
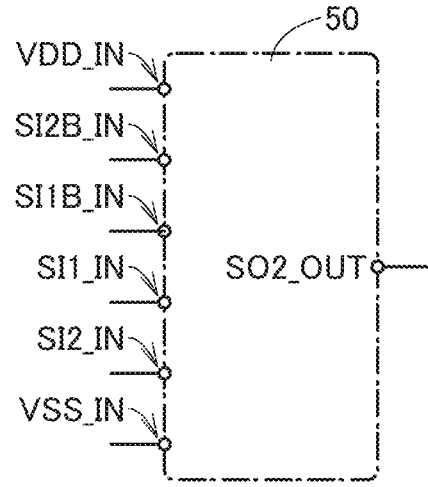

The semiconductor device 40 is represented by symbols shown in FIG. 9A and the semiconductor device 50 is represented by symbols shown in FIG. 9B, for example. An example of combining these semiconductor devices is described below.

FIG. 9A is a diagram showing the symbols of the semiconductor device 40 and shows the wiring VSS_IN, the wiring VDD_IN, the input terminal SI1_IN, the input terminal SI2_IN, the input terminal SI1B_IN, the input terminal SI2B_IN, and the output terminal SO1_OUT, which are used for input and output.

FIG. 9B is a diagram showing the symbols of the semiconductor device 50 and shows the wiring VSS_IN, the wiring VDD_IN, the input terminal SI1_IN, the input terminal SI2_IN, the input terminal SI1B_IN, the input terminal SI2B_IN, and the output terminal SO2_OUT, which are used for input and output.

Figure 10A:
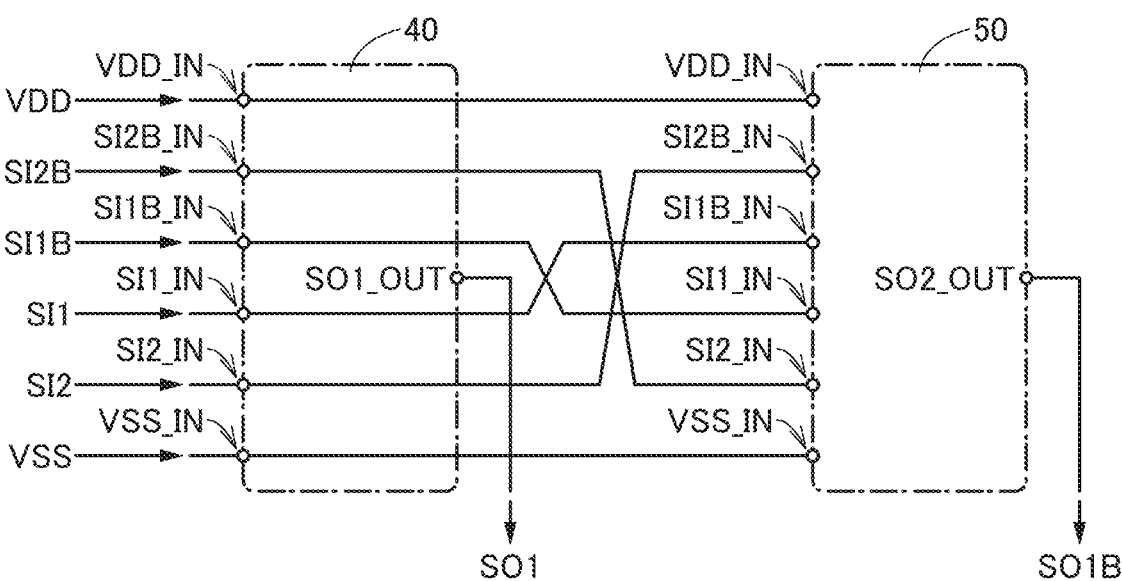
FIG. 10A and FIG. 10B are block diagrams each showing a configuration example of a semiconductor device.

FIG. 10A is a block diagram showing a configuration example of a semiconductor device 60. The semiconductor device 60 includes the semiconductor device 40 and the semiconductor device 50. The potentials and the signals that are input to or output from the semiconductor device 40 and the semiconductor device 50 are indicated using arrows provided on the extension of the wirings.

In the semiconductor device 40 included in the semiconductor device 60, the signal SI1 is input to the input terminal SI1_IN, the signal SI2 is input to the input terminal SI2_IN, the signal SI1B is input to the input terminal SI1B_IN, the signal SI2B is input to the input terminal SI2B_IN, and the signal SO1 is output from the output terminal SO1_OUT. Meanwhile, in the semiconductor device 50 included in the semiconductor device 60, the signal SI1B is input to the input terminal SI1_IN, the signal SI2B is input to the input terminal SI2_IN, the signal SI1 is input to the input terminal SI1B_IN, the signal SI2 is input to the input terminal SI2B_IN, and the signal SO1B is output from the output terminal SO2_OUT.

Figure 11:
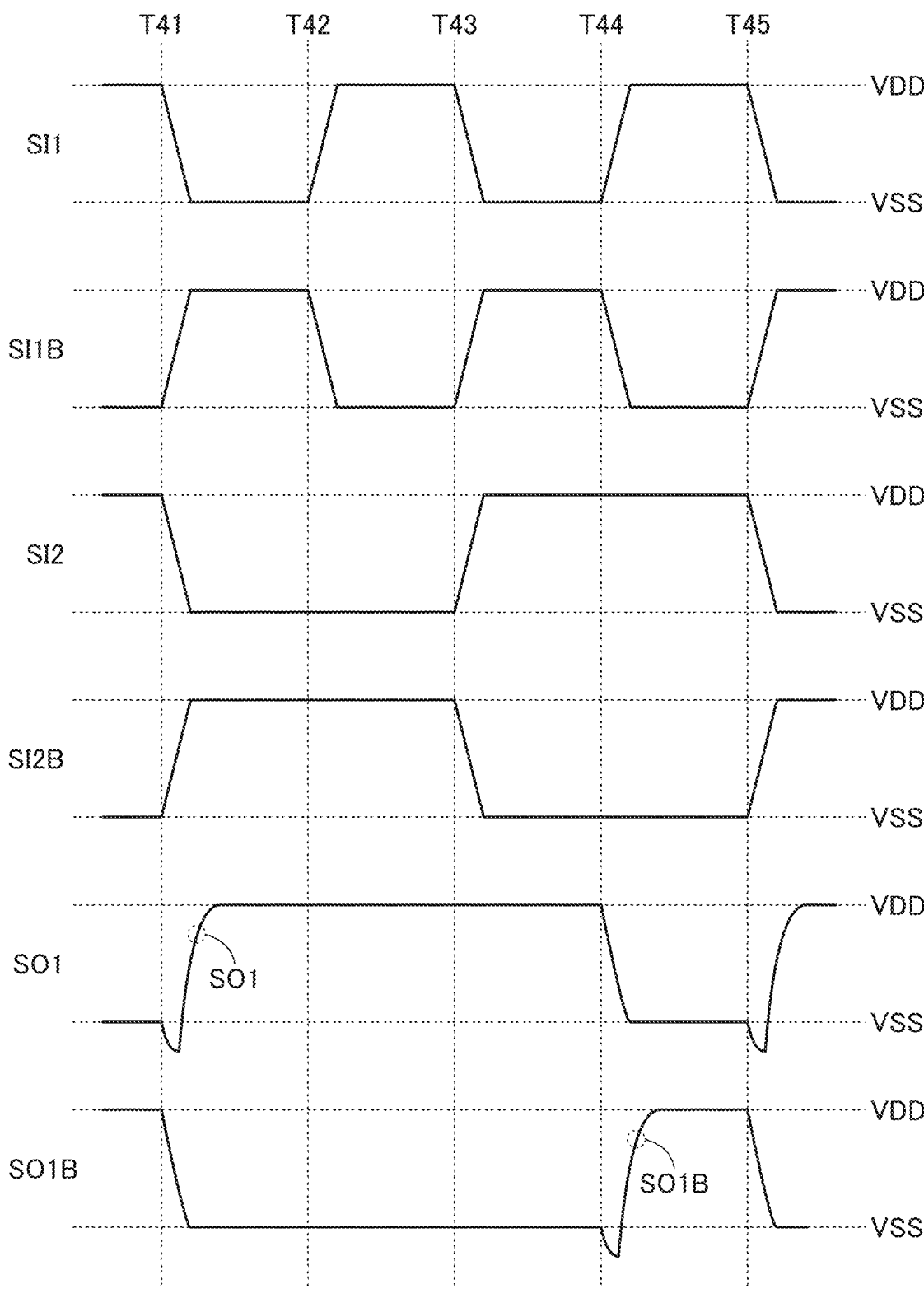
FIG. 11 is a timing chart.

Next, FIG. 11 shows timing charts showing an operation example of the semiconductor device 60. The timing charts of the signal SI1, the signal SI2, the signal SI1B, the signal SI2B, and the signal SOL are the same as those shown in FIG. 8, and a timing chart of the signal SO1B is additionally shown in FIG. 11.

To the semiconductor device 50 included in the semiconductor device 60 and the semiconductor device 50 described with the timing charts in FIG. 8, the signal SI1 and the signal SI1B are input in reverse, and so are the signal SI2 and the signal SI2B. Thus, the semiconductor device 50 included in the semiconductor device 60 outputs the signal SO1B at a high level from the output terminal SO2_OUT when the signal SI1B and the signal SI2B are at a low level. That is, the signal SO1B is a signal with the inverted logic of the signal SO1.

Figure 10B:
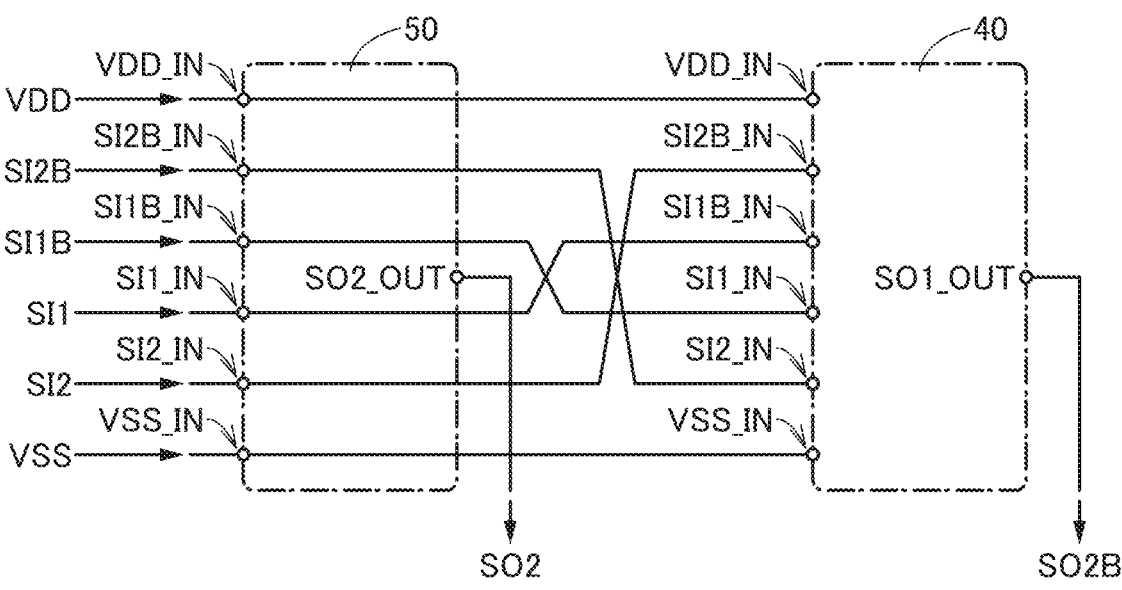

In addition, FIG. 10B is a block diagram showing a configuration example of a semiconductor device 70. The semiconductor device 70 includes the semiconductor device 50 and semiconductor device 40. The potentials and the signals that are input to or output from the semiconductor device 40 and the semiconductor device 50 are indicated using arrows provided on the extension of the wirings.

In the semiconductor device 50 included in the semiconductor device 70, the signal SI1 is input to the input terminal SI1_IN, the signal SI2 is input to the input terminal SI2_IN, the signal SI1B is input to the input terminal SI1B_IN, the signal SI2B is input to the input terminal SI2B_IN, and the signal SO2 is output from the output terminal SO2_OUT. Meanwhile, in the semiconductor device 40 included in the semiconductor device 70, the signal SI1B is input to the input terminal SI1_IN, the signal SI2B is input to the input terminal SI2_IN, the signal SI1 is input to the input terminal SI1B_IN, the signal SI2 is input to the input terminal SI2B_IN, and the signal SO2B is output from the output terminal SO1_OUT.

Figure 12:
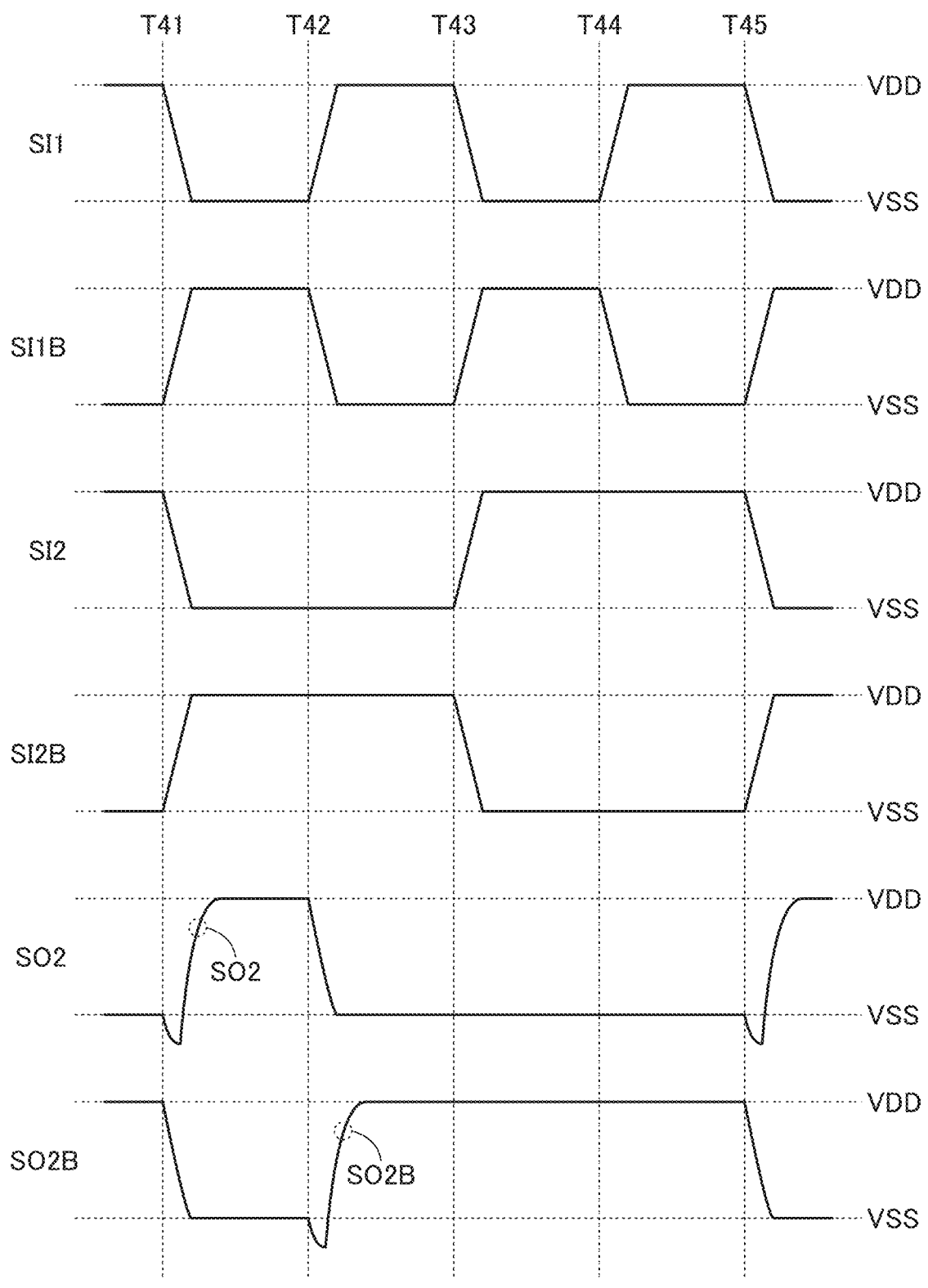
FIG. 12 is a timing chart.

Next, FIG. 12 shows timing charts showing an operation example of the semiconductor device 70. The timing charts of the signal SI1, the signal SI2, the signal SI1B, the signal SI2B, and the signal SO2 are the same as those shown in FIG. 8, and a timing chart of the signal SO2B is additionally shown in FIG. 12.

To the semiconductor device 40 included in the semiconductor device 70 and the semiconductor device 40 described with the timing charts in FIG. 8, the signal SI1 and the signal SI1B are input in reverse, and so are the signal SI2 and the signal SI2B. Thus, the semiconductor device 40 included in the semiconductor device 70 outputs the signal SO2B at a low level from the output terminal SO1_OUT when the signal SI1B and the signal SI2B are at a high level. That is, the signal SO2B is a signal with the inverted logic of the signal SO2.

As described above, the signal SI1, the signal SI2, the signal SI1B, and the signal SI2B are input to the semiconductor device 60 and the semiconductor device 60 outputs the signal SO1 and the signal SO1B. In addition, the signal SI1, the signal SI2, the signal SI1B, and the signal SI2B are input to the semiconductor device 70 and the semiconductor device 70 outputs the signal SO2 and the signal SO2B. The signal SO1B is a signal with the inverted logic of the signal SO1, and the signal SO2B is a signal with the inverted logic of the signal SO2.

That is, the semiconductor device 30, the semiconductor device 60, and the semiconductor device 70 can be electrically connected to each other, and a general-purpose logic circuit can be formed using the semiconductor device 30, the semiconductor device 60, and the semiconductor device 70.

Note that this embodiment can be implemented in combination with the other embodiments described in this specification as appropriate.

Embodiment 3

This embodiment describes structure examples of an OS transistor that can be used as the transistor included in the semiconductor device 10, the transistor included in the semiconductor device 20, the transistor included in the semiconductor device 40, and the transistor included in the semiconductor device 50, which are described in the above embodiments. Note that an OS transistor is a thin film transistor and can be provided to be stacked; therefore, in this embodiment, a structure example of a semiconductor device in which an OS transistor is provided above a Si transistor formed on a single crystal silicon substrate will be described.

<Structure Example of Semiconductor Device>

Figure 13:
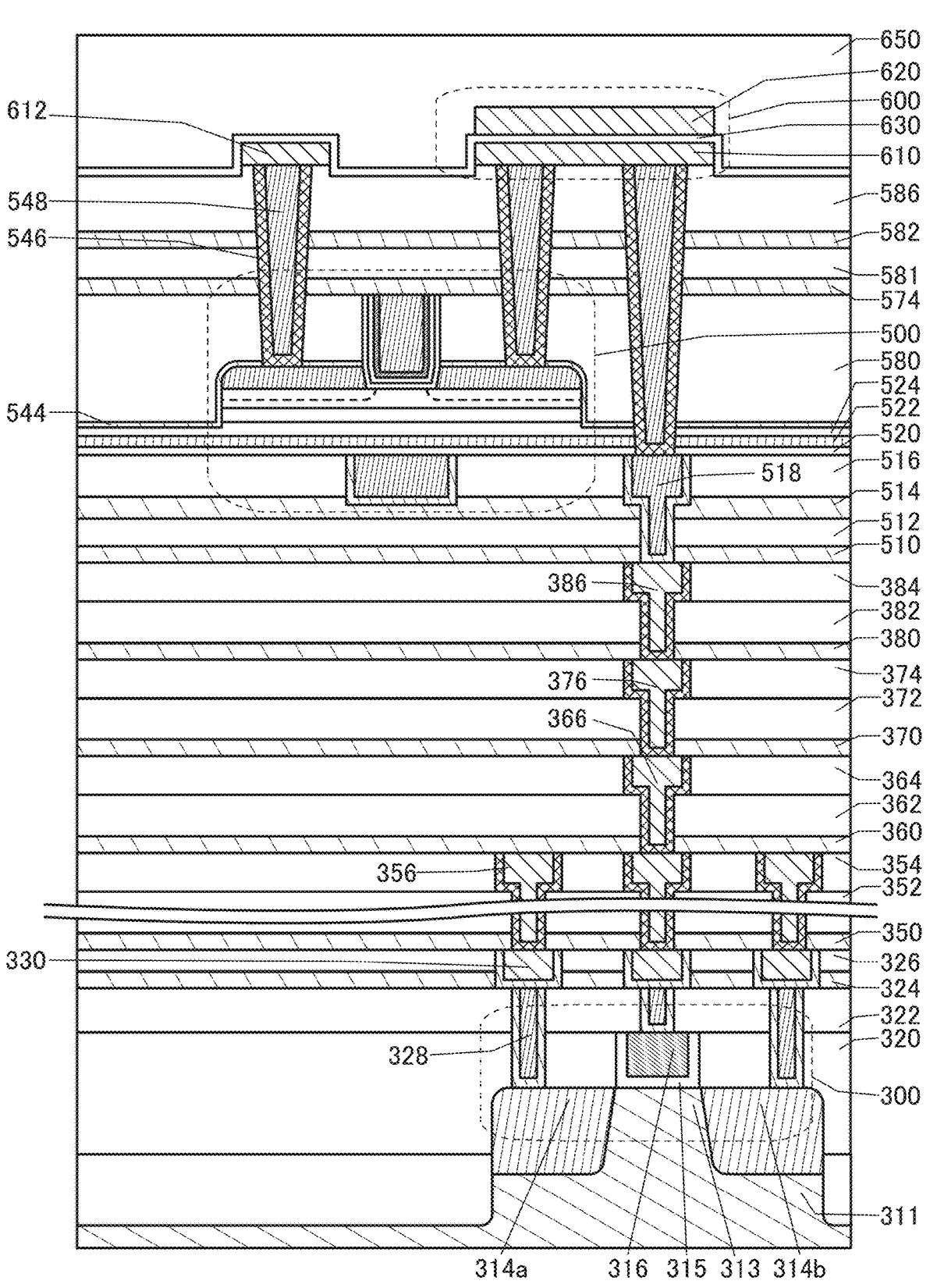
FIG. 13 is a cross-sectional view illustrating a structure example of a semiconductor device.

A semiconductor device illustrated in FIG. 13 includes a transistor 300, a transistor 500, and a capacitor 600. FIG.

14A is a cross-sectional view of the transistor 500 in the channel length direction, FIG. 14B is a cross-sectional view of the transistor 500 in the channel width direction, and FIG. 14C is a cross-sectional view of the transistor 300 in the channel width direction.

The transistor 500 is a transistor including a metal oxide in its channel formation region (an OS transistor). The transistor 500 has the following features: a high voltage can be applied between a source and a drain, an off-state current is less likely to be increased even in a high-temperature environment, and the ratio of an on-state current to an off-state current is high even in a high-temperature environment; therefore, in the above embodiment, the use of this transistor in the semiconductor device 10, the semiconductor device 20, the semiconductor device 40, and the semiconductor device 50 allows the semiconductor devices to have high reliability.

The semiconductor device described in this embodiment includes the transistor 300, the transistor 500, and the capacitor 600 as illustrated in FIG. 13. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314*a* and a low-resistance region 314*b* functioning as a source region and a drain region.

As illustrated in FIG. 14C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314*a* and the low-resistance region 314*b* functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 13 is an example and is not limited to the structure shown therein; an appropriate transistor is used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 13, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 13, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 13, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 13, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor

500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 14A and FIG. 14B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 14A and FIG. 14B, an insulator 544 is preferably positioned between the insulator 580 and the oxide 530a, the oxide 530b, the conductor 542a, and the conductor 542b. In addition, as illustrated in FIG. 14A and FIG. 14B, the conductor 560 preferably includes a conductor 560a provided inside the insulator 550 and a conductor 560b embedded inside the conductor 560a. As illustrated in FIG.

14A and FIG. 14B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where the channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 illustrated in FIG. 13, FIG. 14A, and FIG. 14B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of i-type like the channel formation region. The side surface and the vicinity of the oxide 530 in contact with the conductor 542a and the conductor 542b are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing aluminum oxide, hafnium oxide, tantalum oxide, zirconium oxide, lead zirconate titanate (PZT), strontium titanate (SrTiO$_3$), (Ba,Sr)TiO$_3$ (BST), or the like. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier density of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a bandgap of preferably 2 eV or larger, further preferably 2.5 eV or larger. With the use of a metal oxide having such a wide bandgap, the off-state current of the transistor can be reduced.

Note that semiconductor materials that can be used for the oxide 530 are not limited to the above metal oxides. A semiconductor material having a bandgap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), zirconium selenide ($ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 14A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode and having a two-layer structure is illustrated in FIG. 14A and FIG. 14B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N$_2$O, NO, NO$_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening in the insulator 580 is formed to overlap the region between the conductor 542a and the conductor 542b. Accordingly, the conductor 560 is formed to be embedded in the opening in the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

As the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 13, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

<Structure Example of Transistor>

Note that the structure of the transistor 500 in the semiconductor device described in this embodiment is not limited to the above. Examples of structures that can be used for the transistor 500 will be described below.

<Structure Example 1 of Transistor>

Figures 15A, 15B, 15C:
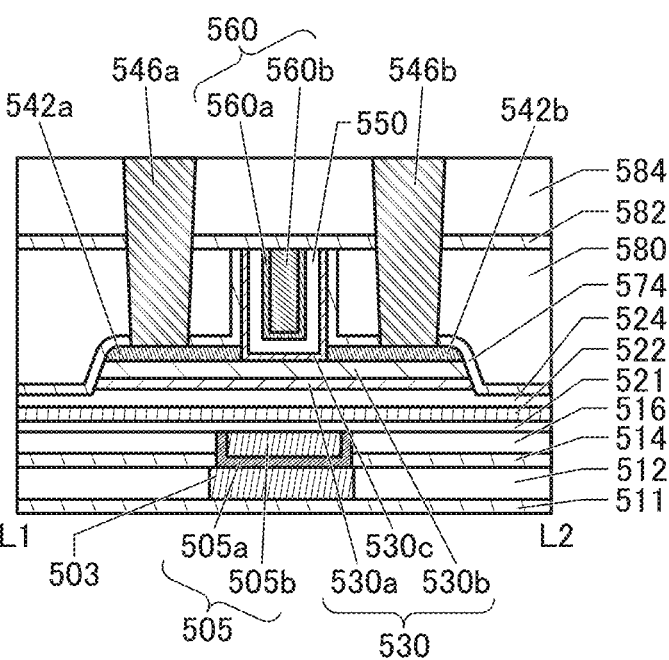
FIG. 15A is a top view illustrating a structure example of a transistor.
FIG. 15B and FIG. 15C are cross-sectional views illustrating the structure example of the transistor.

A structure example of a transistor 510A is described with reference to FIG. 15A, FIG. 15B, and FIG. 15C. FIG. 15A is a top view of the transistor 510A. FIG. 15B is a cross-sectional view of a portion indicated by the dashed-dotted line L1-L2 in FIG. 15A. FIG. 15C is a cross-sectional view of a portion indicated by the dashed-dotted line W1-W2 in FIG. 15A. Note that for clarity of the drawing, some components are not illustrated in the top view of FIG. 15A.

FIG. 15A, FIG. 15B, and FIG. 15C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 15, the oxide 530c, the insulator 550, and the conductor 560 are positioned in an opening portion provided in the insulator 580 with the insulator 574 therebetween. Moreover, the oxide 530c, the insulator 550, and the conductor 560 are positioned between the conductor 542a and the conductor 542b.

The insulator 511 and the insulator 512 each function as an interlayer film.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the top surface of the conductor 503 and the top surface of the insulator 512 can be substantially level with each other. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material, such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 15, but may have a single-layer structure or a stacked-layer structure of four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

In addition, although the conductor 542a and the conductor 542b each having a single-layer structure are illustrated in FIG. 15, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 574 therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. In addition, since the conductor 560 functions as a wiring, a conductor having high conductivity is preferably used as the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a semiconductor device using a transistor that includes an oxide semiconductor and has a high on-state current can be provided. Alternatively, a semiconductor device that uses a transistor including an oxide semiconductor and having a low off-state current can be provided. Alternatively, a semiconductor device that has small variations in electrical characteristics, stable electrical characteristics, and high reliability can be provided.

<Structure Example 2 of Transistor>

Figure 16A:
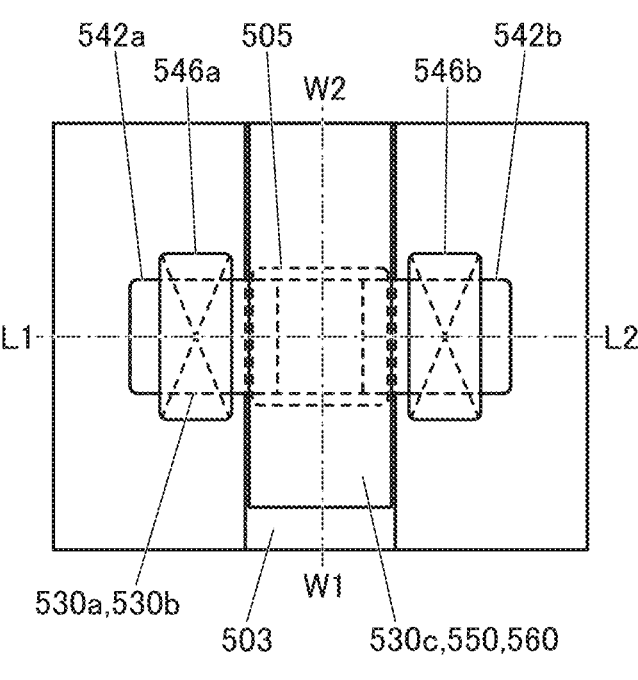
FIG. 16A is a top view illustrating a structure example of a transistor.
Figure 16C:
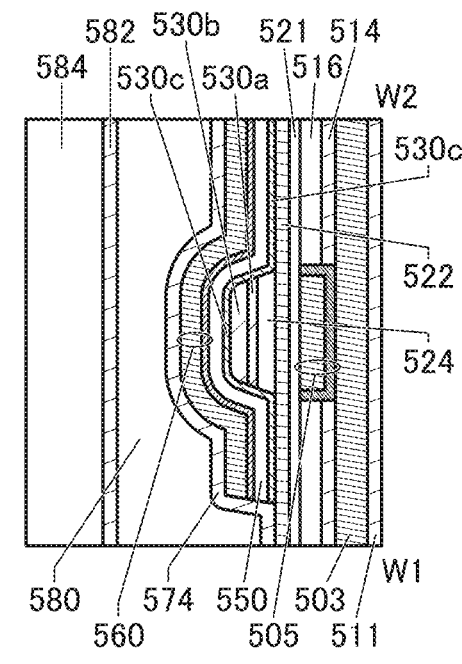
FIG. 16B and FIG. 16C are cross-sectional views illustrating the structure example of the transistor.
Figure 16B:
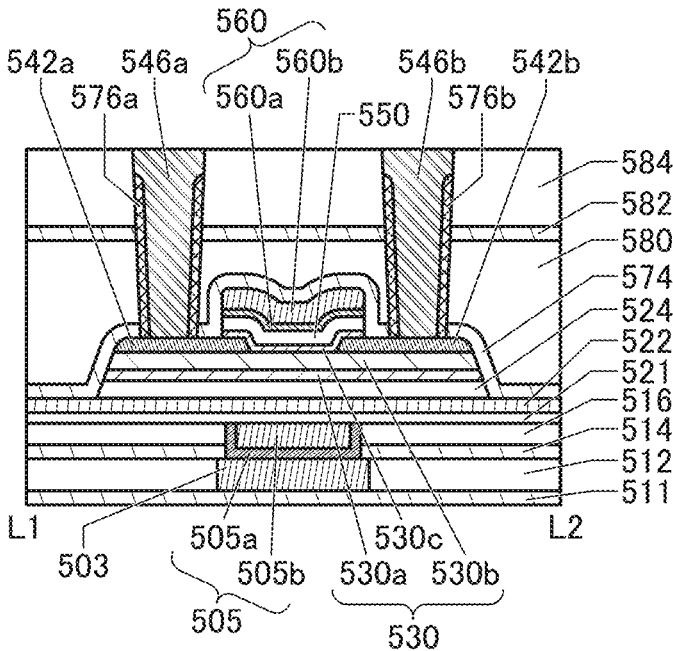

A structure example of a transistor 510B is described with reference to FIG. 16A, FIG. 16B, and FIG. 16C. FIG. 16A is a top view of the transistor 510B. FIG. 16B is a cross-sectional view of a portion indicated by a dashed-dotted line L1-L2 in FIG. 16A. FIG. 16C is a cross-sectional view of a portion indicated by a dashed-dotted line W1-W2 in FIG. 16A. Note that for clarity of the drawing, some components are not illustrated in the top view of FIG. 16A.

The transistor 510B is a modification example of the transistor 510A. Therefore, differences from the transistor 510A will be mainly described to avoid repeated description.

The transistor 510B includes a region where the oxide 530c, the insulator 550, and the conductor 560 overlap the conductor 542 (the conductor 542a and the conductor 542b). With this structure, a transistor having a high on-state current can be provided. Moreover, a transistor having high controllability can be provided.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Structure Example 3 of Transistor>

A structure example of a transistor 510C is described with reference to FIG. 17A, FIG. 17B, and FIG. 17C. FIG. 17A is a top view of the transistor 510C. FIG. 17B is a cross-sectional view of a portion indicated by a dashed-dotted line L1-L2 in FIG. 17A. FIG. 17C is a cross-sectional view of a portion indicated by a dashed-dotted line W1-W2 in FIG. 17A. Note that for clarity of the drawing, some components are not illustrated in the top view of FIG. 17A.

The transistor 510C is a modification example of the transistor 510A. Therefore, differences from the transistor 510A will be mainly described to avoid repeated description.

In the transistor 510C illustrated in FIG. 17, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used as the conductor 542 is used. It is preferable that the thickness of the conductor 547 be at least greater than that of the conductor 542.

In the transistor 510C illustrated in FIG. 17, because of the above structure, the conductor 542 can be closer to the conductor 560 than in the transistor 510A. Alternatively, the conductor 560 can overlap an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 17 may have a structure in which an insulator 545 is positioned over and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 15, in the transistor 510C illustrated in FIG. 17, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Structure Example 4 of Transistor>

A structure example of a transistor 510D is described with reference to FIG. 18A, FIG. 18B, and FIG. 18C. FIG. 18A is a top view of the transistor 510D. FIG. 18B is a cross-sectional view of a portion indicated by a dashed-dotted line L1-L2 in FIG. 18A. FIG. 18C is a cross-sectional view of a portion indicated by a dashed-dotted line W1-W2 in FIG. 18A. Note that for clarity of the drawing, some components are not illustrated in the top view in FIG. 18A.

The transistor 510D is a modification example of the above transistors. Therefore, differences from the above transistors will be mainly described to avoid repeated description.

In FIG. 18A to FIG. 18C, the conductor 503 is not provided, and the conductor 505 that has a function of a second gate is made to function also as a wiring. In addition, the insulator 550 is provided over the oxide 530c and a metal oxide 552 is provided over the insulator 550. In addition, the conductor 560 is provided over the metal oxide 552, and an insulator 570 is provided over the conductor 560. Furthermore, an insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In this case, when the conductor 560 is deposited by a sputtering method, the electrical resistance of the metal oxide 552 is lowered so that the metal oxide 552 can be a conductive layer. This can be referred to as an OC (Oxide Conductor) electrode.

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

Note that an insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the conductor 560 does not overlap the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

<Structure Example 5 of Transistor>

Figure 19A:
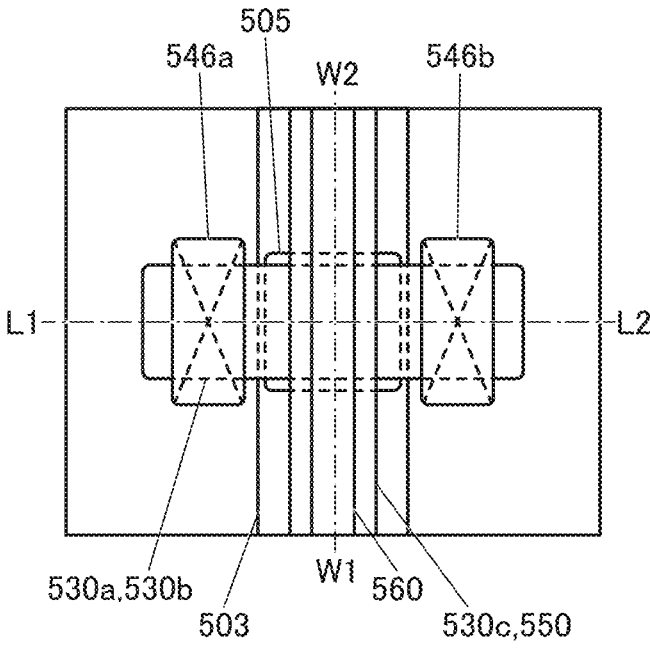
FIG. 19A is a top view illustrating a structure example of a transistor.
Figure 19C:
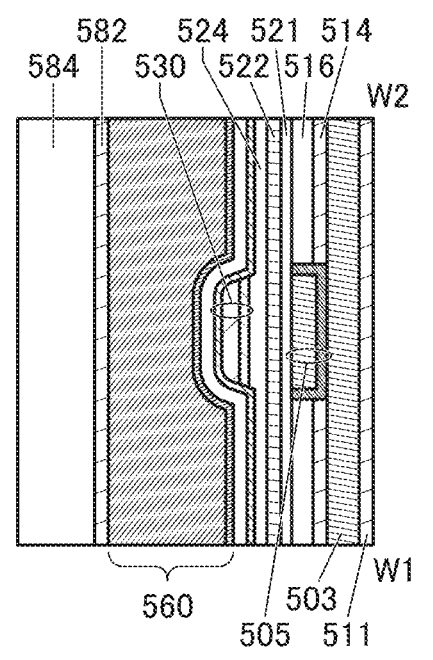
FIG. 19B and FIG. 19C are cross-sectional views illustrating the structure example of the transistor.
Figure 19B:
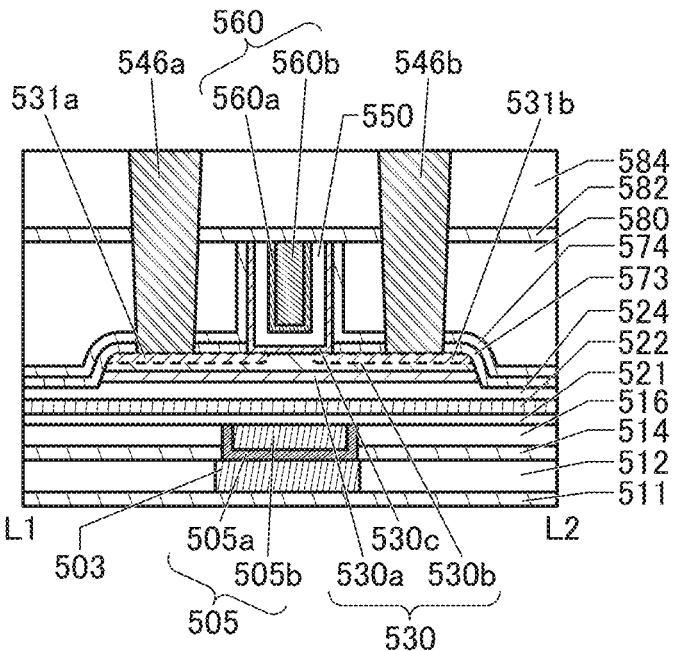

A structure example of a transistor 510E is described with reference to FIG. 19A to FIG. 19C. FIG. 19A is a top view of the transistor 510E. FIG. 19B is a cross-sectional view of a portion indicated by the dashed-dotted line L1-L2 in FIG. 19A. FIG. 19C is a cross-sectional view of a portion indicated by the dashed-dotted line W1-W2 in FIG. 19A. Note that for clarity of the drawing, some components are not illustrated in the top view in FIG. 19A.

The transistor 510E is a modification example of the above transistors. Therefore, differences from the above transistors will be mainly described to avoid repeated description.

In FIG. 19A to FIG. 19C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 19 are regions where an element described below is added to the oxide 530b. The regions 531 can be formed using a dummy gate, for example.

Specifically, a dummy gate is provided over the oxide 530b, and the element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by SIMS or the like.

In particular, boron and phosphorus are preferable because an apparatus used in a manufacturing line for amorphous silicon or low-temperature polysilicon can be used, for example. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap the region 531.

Specifically, after an insulating film to be the insulator 580 is provided over the insulating film to be the insulator 574, the insulating film to be the insulator 580 is subjected to CMP treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor illustrated in FIG. 19 can be formed.

Note that the insulator 573 and the insulator 574 are not essential components. Design is appropriately set in consideration of required transistor characteristics.

The cost of the transistor illustrated in FIG. 19 can be reduced because an existing apparatus can be used and the conductor 542 is not provided.

<Structure Example 6 of Transistor>

Figures 20A, 20B, 20C:
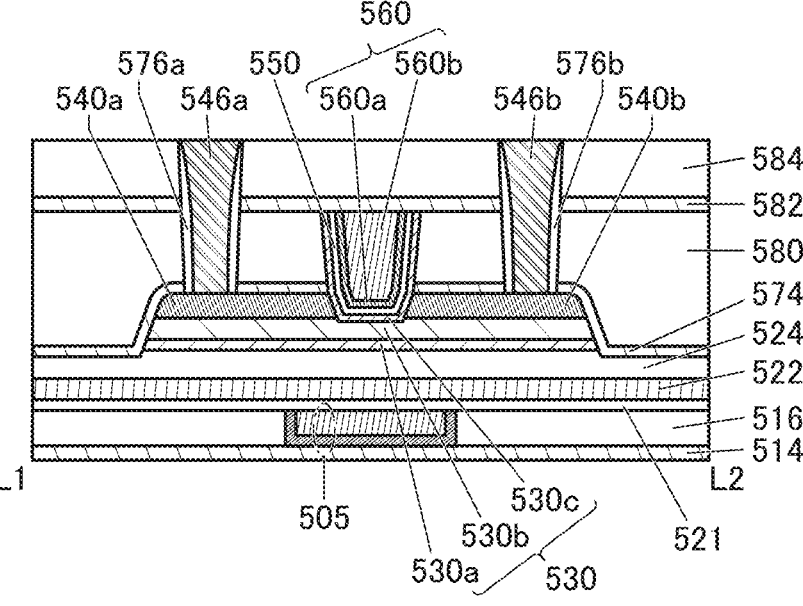
FIG. 20A is a top view illustrating a structure example of a transistor.
FIG. 20B and FIG. 20C are cross-sectional views illustrating the structure example of the transistor.

A structure example of a transistor 510F is described with reference to FIG. 20A to FIG. 20C. FIG. 20A is a top view of the transistor 510F. FIG. 20B is a cross-sectional view of a portion indicated by a dashed-dotted line L1-L2 in FIG. 20A. FIG. 20C is a cross-sectional view of a portion indicated by a dashed-dotted line W1-W2 in FIG. 20A. Note that for clarity of the drawing, some components are not illustrated in the top view in FIG. 20A.

The transistor 510F is a modification example of the transistor 510A. Therefore, differences from the above transistors will be mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures in the manufacturing process (what is called thermal budget).

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide with In:Ga: Zn=1:3:4 [atomic ratio] or 1:1:0.5 [atomic ratio] is used. As the oxide 530b, a metal oxide with In:Ga:Zn=4:2:3 [atomic ratio] or 3:1:2 [atomic ratio] is used. As the oxide 530c, a metal oxide with In:Ga:Zn=1:3:4 [atomic ratio], In:Ga: Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga: Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable semiconductor device can be provided.

A metal oxide functioning as an oxide semiconductor is preferably used as the oxide 530. For example, as the metal oxide to be the channel formation region in the oxide 530, a metal oxide having a bandgap of 2 eV or larger, preferably 2.5 eV or larger is preferably used. With the use of a metal oxide having such a wide bandgap, the off-state current of the transistor can be reduced. With the use of such a transistor, a semiconductor device with low power consumption can be provided.

<Structure Example 7 of Transistor>

A structure example of a transistor 510G is described with reference to FIG. 21A and FIG. 21B. The transistor 510G is a modification example of the transistor 500. Therefore, differences from the above transistors will be mainly described to avoid repeated description. Note that the structure illustrated in FIG. 21A and FIG. 21B can be employed for other transistors, such as the transistor 300, included in the semiconductor device of one embodiment of the present invention.

Figure 21A:
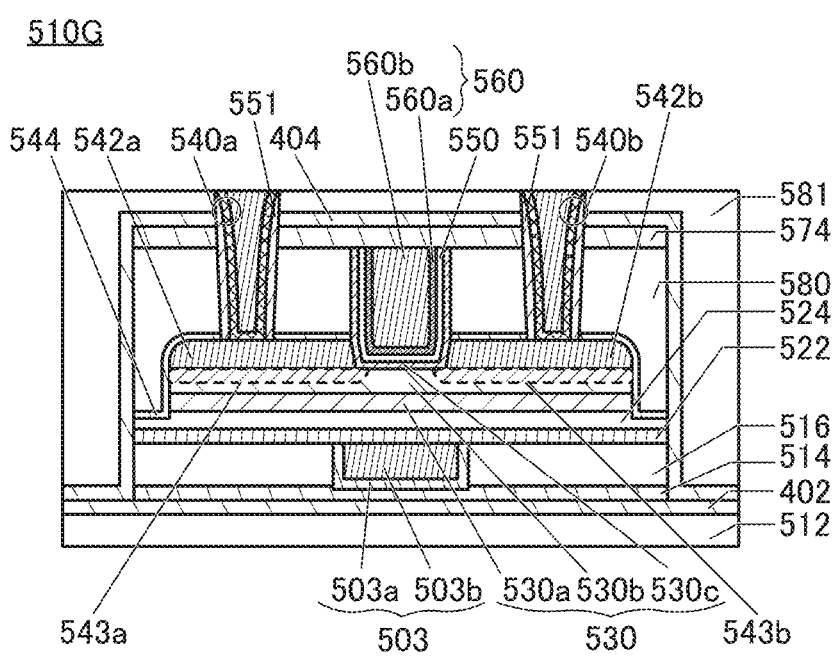
FIG. 21A and FIG. 21B are cross-sectional views illustrating a structure example of a transistor.
Figure 21B:
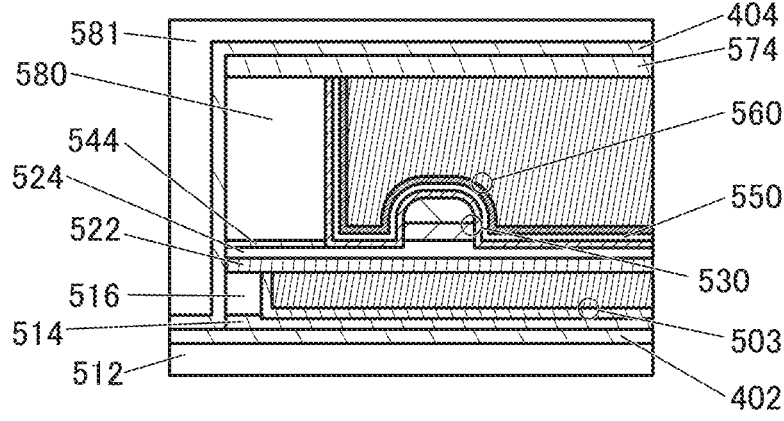

FIG. 21A is a cross-sectional view of the transistor 510G in the channel length direction, and FIG. 21B is a cross-sectional view of the transistor 510G in the channel width direction. The transistor 510G illustrated in FIG. 21A and FIG. 21B is different from the transistor 500 illustrated in FIG. 14A and FIG. 14B in including the insulator 402 and the insulator 404. Another difference from the transistor 500 illustrated in FIG. 14A and FIG. 14B is that the insulator 551 is provided in contact with a side surface of the conductor 540a and the insulator 551 is provided in contact with a side surface of the conductor 540b. Another difference from the transistor 500 illustrated in FIG. 14A and FIG. 14B is that the insulator 520 is not provided.

In the transistor 510G illustrated in FIG. 21A and FIG. 21B, the insulator 402 is provided over the insulator 512. In addition, the insulator 404 is provided over the insulator 574 and the insulator 402.

The transistor 510G illustrated in FIG. 21A and FIG. 21B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is particularly preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510G. Consequently, the reliability of the semiconductor device of one embodiment of the present invention can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the semiconductor device of one embodiment of the present invention can be increased.

Figure 22:
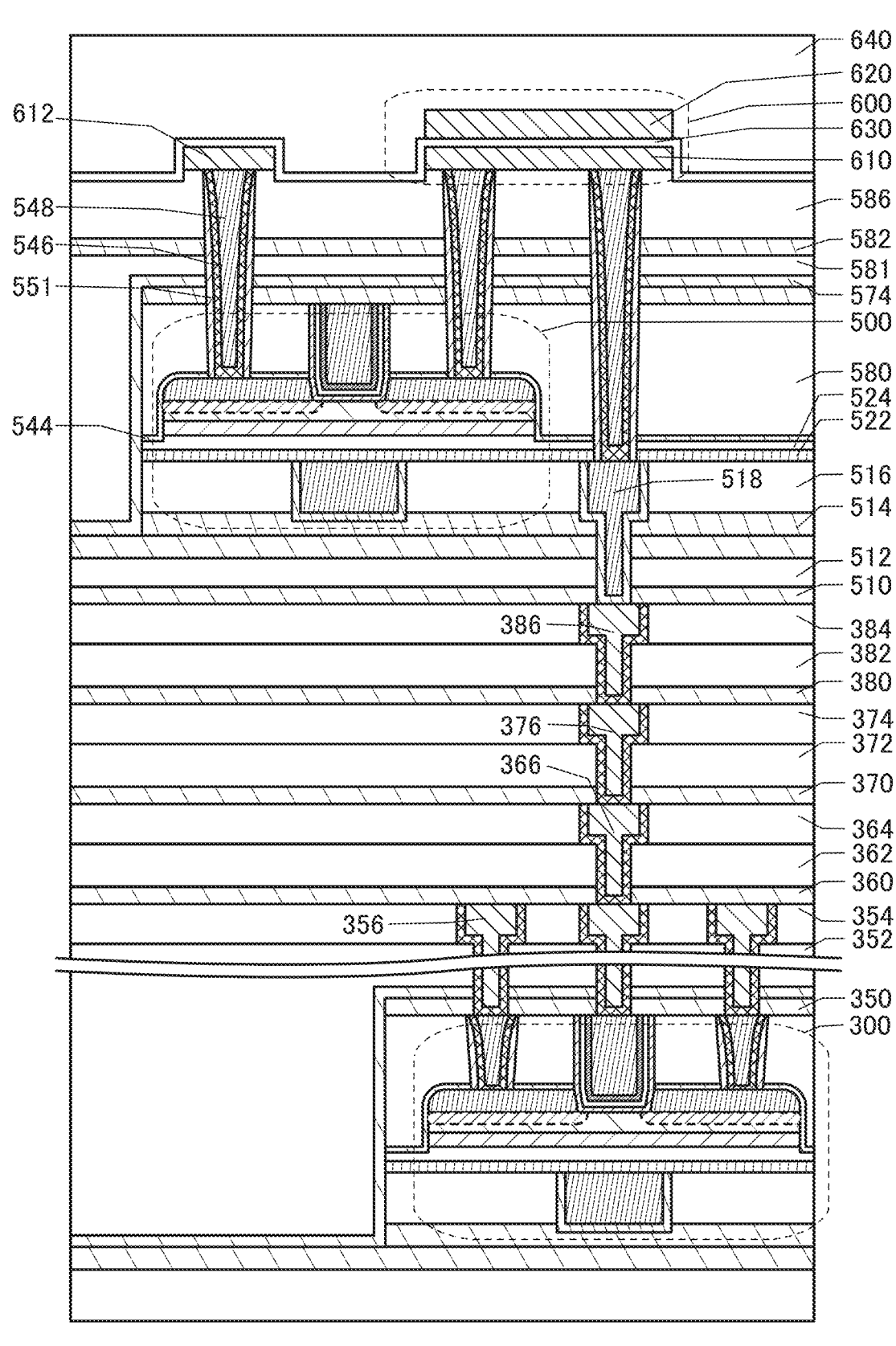
FIG. 22 is a cross-sectional view illustrating a structure example of a semiconductor device.

FIG. 22 is a cross-sectional view illustrating a structure example of the semiconductor device in the case where the transistor 500 and the transistor 300 have the structure illustrated in FIG. 21A and FIG. 21B. The insulator 551 is provided on the side surface of the conductor 546.

Figures 23A, 23B:
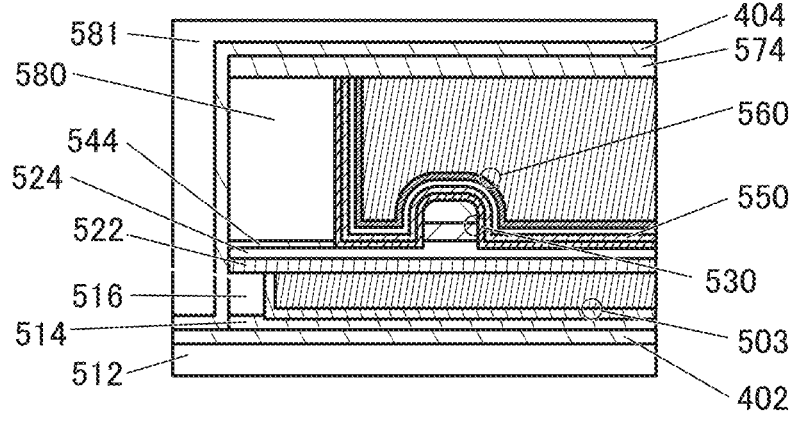
FIG. 23A and FIG. 23B are cross-sectional views illustrating a structure example of a transistor.

FIG. 23A and FIG. 23B shows a modification example of the transistor illustrated in FIG. 21A and FIG. 21B. FIG. 23A is a cross-sectional view of the transistor in the channel length direction, and FIG. 23B is a cross-sectional view of the transistor in the channel width direction. The transistor illustrated in FIG. 23A and FIG. 23B is different from the transistor illustrated in FIG. 21A and FIG. 21B in that the oxide 530c has a two-layer structure of an oxide 530c1 and an oxide 530c2. The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga: Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor illustrated in FIG. 14A and FIG. 14B can also have a two-layer structure of the oxide 530c1 and the oxide 530c2.

The transistor illustrated in FIG. 23A and FIG. 23B can be employed for the transistor 500, the transistor 300, or both thereof.

Note that this embodiment can be implemented in combination with the other embodiments described in this specification as appropriate.

Embodiment 4

In this embodiment, the composition of a metal oxide that can be used in the OS transistor described in the above embodiment will be described.

<Composition of Metal Oxide>

In this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of a transistor, a thin film having high crystallinity is preferably used. With the use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable against high temperatures in the manufacturing process (or thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. An oxide semiconductor of one embodiment of the present invention may include two or more of an amorphous oxide semiconductor, a polycrystalline oxide semiconductor, the a-like OS, the nc-OS, and the CAAC-OS.

<Transistor Including Oxide Semiconductor>

Next, the case where the above oxide semiconductor is used in a transistor will be described.

When the above oxide semiconductor is used in a transistor, a transistor having high field-effect mobility can be achieved. In addition, a transistor having high reliability can be achieved.

An oxide semiconductor with a low carrier density is preferably used for the transistor. To reduce the carrier density of an oxide semiconductor film, the impurity concentration in the oxide semiconductor film is lowered so that the density of defect states can be reduced. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states. Note that the carrier density of an oxide semiconductor that can be used in one embodiment of the present invention is within the range described in Embodiment 3.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of a transistor, reducing the concentration in an oxide semiconductor is effective. In addition, in order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is lower than or equal to $1 \times 10^{18}$ atoms/$cm^3$, preferably lower than or equal to $2 \times 10^{16}$ atoms/$cm^3$.

When containing nitrogen, the oxide semiconductor easily becomes n-type by generation of electrons serving as carriers and an increase in carrier density. As a result, a transistor using an oxide semiconductor containing nitrogen for its channel formation region is likely to have normally-on characteristics. For this reason, nitrogen in the oxide semiconductor is preferably reduced as much as possible. For example, the nitrogen concentration in the oxide semiconductor is lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$ in SIMS.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. For this reason, hydrogen in the oxide semiconductor is preferably reduced as much as possible. Specifically, the hydrogen concentration in the oxide semiconductor obtained by SIMS is lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a semiconductor device utilizing the characteristics of low leakage current of the transistor have been studied.

Note that this embodiment can be implemented in combination with the other embodiments described in this specification as appropriate.

REFERENCE NUMERALS

C11: capacitor, C12: capacitor, C21: capacitor, C22: capacitor, C41: capacitor, C42: capacitor, C43: capacitor, C51: capacitor, C52: capacitor, C53: capacitor, N11: node, N21: node, N41: node, N51: node, SI1: signal, SI1_IN: input terminal, SI1B: signal, SI1B_IN: input terminal, SI2: signal, SI2_IN: input terminal, SI2B: signal, SI2B_IN: input terminal, SO1: signal, SO1_OUT: output terminal, SO1B: signal, SO2: signal, SO2_OUT: output terminal, SO2B: signal, 10: semiconductor device, 10_1: semiconductor device, 10_2: semiconductor device, 11: transistor, 12: transistor, 13: transistor, 14: transistor, 20: semiconductor device, 21: transistor, 22: transistor, 23: transistor, 30: semiconductor device, 31: transistor, 32: transistor, 40: semiconductor device, 41: transistor, 42: transistor, 43: transistor, 44: transistor, 45: transistor, 46: transistor, 47: transistor, 50: semiconductor device, 51: transistor, 52: transistor, 53: transistor, 54: transistor, 55: transistor, 56: transistor, 57: transistor, 60: semiconductor device, 70: semiconductor device, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503a: conductor, 503b: conductor, 505: conductor, 505a: conductor, 505b: conductor, 510: insulator, 510A: transistor, 510B: transistor, 510C: transistor, 510D: transistor, 510E: transistor, 510F: transistor, 510G: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 530c1: oxide, 530c2: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 551: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator. 582: insulator, 584: insulator. 586: insulator. 600: capacitor. 610: conductor. 612: conductor. 620: conductor, 630: insulator, 650: insulator

The invention claimed is:

1. A semiconductor device comprising:
first to seventh transistors;
first to third capacitors;
first and second wirings;
first to fourth input terminals; and
an output terminal,
wherein one of a source and a drain of the sixth transistor and one of a source and a drain of the seventh transistor are electrically connected to the first wiring,
wherein the other of the source and the drain of the sixth transistor is electrically connected to the other of the source and the drain of the seventh transistor, one of a source and a drain of the third transistor, one terminal of the third capacitor, and a gate of the fifth transistor,
wherein the other of the source and the drain of the third transistor is electrically connected to one of a source and a drain of the fourth transistor,
wherein the other of the source and the drain of the fourth transistor is electrically connected to the second wiring,
wherein a gate of the sixth transistor is electrically connected to the first input terminal, one terminal of the first capacitor, and a gate of the first transistor,
wherein a gate of the seventh transistor is electrically connected to the second input terminal, one terminal of the second capacitor, and a gate of the second transistor,
wherein a gate of the third transistor is electrically connected to the third input terminal,
wherein a gate of the fourth transistor is electrically connected to the fourth input terminal,
wherein one of a source and a drain of the first transistor and one of a source and a drain of the second transistor are electrically connected to the first wiring, wherein the other of the source and the drain of the first transistor is electrically connected to the other of the source and the drain of the second transistor, the other terminal of the first capacitor, the other terminal of the second capacitor, the other terminal of the third capacitor, one of a source and a drain of the fifth transistor, and the output terminal, and wherein the other of the source and the drain of the fifth transistor is electrically connected to the second wiring.

2. The semiconductor device according to claim 1, wherein a first potential is supplied to the first wiring, wherein a second potential is supplied to the second wiring, wherein the second potential is a potential higher than the first potential, wherein a first signal is input to the first input terminal, wherein a second signal is input to the second input terminal, wherein a third signal is input to the third input terminal, wherein a fourth signal is input to the fourth input terminal, wherein the third signal is a signal with an inverted logic of the first signal, and wherein the fourth signal is a signal with an inverted logic of the second signal.

3. The semiconductor device according to claim 1, wherein the first to seventh transistors are each an n-channel transistor.

4. The semiconductor device according to claim 1, wherein the first to seventh transistors each comprise a metal oxide in a channel formation region.

\* \* \* \* \*